United States Patent
Horiguchi et al.

(10) Patent No.: US 6,281,711 B1
(45) Date of Patent: *Aug. 28, 2001

(54) SEMICONDUCTOR INTEGRATED CIRCUIT DEVICE HAVING POWER REDUCTION MECHANISM

(75) Inventors: Masashi Horiguchi, Kawasaki; Kunio Uchiyama, Kodaira; Kiyoo Itoh, Higashi-kurume; Takeshi Sakata, Kunitachi; Masakazu Aoki, Tokorozawa; Takayuki Kawahara, Hachioji, all of (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/291,977

(22) Filed: Apr. 15, 1999

Related U.S. Application Data

(63) Continuation of application No. 09/123,480, filed on Jul. 28, 1998, which is a continuation of application No. 08/653,248, filed on May 24, 1996, now Pat. No. 5,828,235, which is a continuation of application No. 08/193,765, filed on Feb. 8, 1994, now Pat. No. 5,583,457, which is a continuation-in-part of application No. 08/045,792, filed on Apr. 14, 1993.

(30) Foreign Application Priority Data

| Apr. 14, 1992 | (JP) | 4-94070 |
| Apr. 14, 1992 | (JP) | 4-94077 |
| Dec. 25, 1992 | (JP) | 4-345901 |
| Feb. 10, 1993 | (JP) | 5-22392 |

(51) Int. Cl.[7] .............................................. H03K 19/094
(52) U.S. Cl. ............................................. 326/121; 326/83
(58) Field of Search .................................. 326/119, 121, 326/83, 112; 327/544

(56) References Cited

U.S. PATENT DOCUMENTS

| 3,739,193 | 6/1973 | Pryor . |
| 4,473,762 | 9/1984 | Iwahashi et al. . |
| 4,624,006 | 11/1986 | Rempfer et al. . |
| 4,797,580 | 1/1989 | Sunter . |
| 4,825,106 | 4/1989 | Tipon et al. . |

(List continued on next page.)

FOREIGN PATENT DOCUMENTS

| 2-179121 | 7/1990 | (JP) . |
| 2-246516 | 10/1990 | (JP) . |
| 3-49409 | 3/1991 | (JP) . |
| 60-48525 | 2/1994 | (JP) . |

OTHER PUBLICATIONS

Mano. Computer Engineering: Hardware Design. Prentice Hall, pp. 122–124, 1988.*

(List continued on next page.)

Primary Examiner—Michael Tokar
Assistant Examiner—James A Cho
(74) Attorney, Agent, or Firm—Mattingly, Stanger & Malur, P.C.

(57) ABSTRACT

A semiconductor integrated circuit device is composed of logic gates each provided with at least two MOS transistors. The logic gates are connected to a first potential point and a second potential point. The semiconductor integrated circuit device includes a current control device connected between the logic gate and the first potential point and/or between the logic gate and the second potential point for controlling a value of a current flowing in the logic gate depending on an operating state of the logic gate. The circuit can be used in devices that cycle in operation between high and low power consumption modes, such as microprocessors that have both an operation mode and a low power back-up or sleep mode used for power reduction.

14 Claims, 34 Drawing Sheets

U.S. PATENT DOCUMENTS

| | | |
|---|---|---|
| 4,859,870 | 8/1989 | Wong et al. . |
| 4,894,558 * | 1/1990 | Conkle et al. ................... 326/121 |
| 4,999,519 | 3/1991 | Kitsukawa et al. . |
| 5,034,629 | 7/1991 | Kanugasa et al. . |
| 5,051,625 | 9/1991 | Ikeda et al. . |
| 5,101,119 | 3/1992 | Yoshimori et al. . |
| 5,115,150 | 5/1992 | Ludwig . |
| 5,179,298 | 1/1993 | Hirano et al. . |
| 5,258,666 | 11/1993 | Furuki . |
| 5,274,601 | 12/1993 | Kawahara et al. . |
| 5,349,666 | 9/1994 | Adachi et al. . |
| 5,355,503 | 10/1994 | Soffel et al. . |
| 5,359,243 | 10/1994 | Norman . |
| 5,461,338 | 10/1995 | Hirayama et al. . |
| 5,486,774 | 1/1996 | Douseki et al. . |
| 5,526,313 | 6/1996 | Etoh et al. . |
| 5,557,231 | 9/1996 | Yamaguchi et al. . |
| 5,583,457 | 12/1996 | Honguchi et al. . |
| 5,726,475 | 3/1998 | Sawada et al. . |
| 5,828,235 | 10/1998 | Horiguchi et al. . |
| 5,880,604 | 3/1999 | Kawahara et al. . |

OTHER PUBLICATIONS

1989 International Symposium on VLSI Technology, Systems and Application, Proceedings of Technical Papers, pp. 188–192 (May 1989).

ISSCC Digest of Technical Papers, pp. 248–249, Feb. 1989.

Reviews and Prospects of Deep Sub Micron DRAM Technology, 1991 International Conference on Solid State Devices and Materials, Yokohama 1991, pp. 468–471.

Intro to VLSI Systems, "Scaling Down the Dimensions of MOS Circuits and Systems," Mead et al, pp. 33–37.

ISSCC93, Session 3, 256Mb DRAM Technologies for File Applications, G. Kitsukawa et al, published Feb. 24, 1993.

Symp. VLSI Circ. 93, "Switched–Source–Impedance CMOS Circuit for Low Standby Substhreshold Current Giga–Scale LSI's," M. Horiguchi et al, published May 19, 1993.

Simp. VLSI Circ. 93, "Subthreshold–Current Reduction Circuits for Multi–Gigabit DRAM's," T. Sakata et al, published May 19, 1993.

Symp. VLSI Circ. 93, "Stand–by Active Mode Logic for Sub–1 V 1G/4Gb DRAMs" D. Takashima et al, published May 19, 1993.

Symposium on ULSI Circuits, Digest of Technical Papers, Jun. 1992, pp. 82–83.

IEEE International Solid–State Circuits Conference, ISSCC Digest of Technical Papers, Feb. 1985, pp. 254–255 and 358–359.

Nikkei Electronics, Sep. 2, 1991, pp. 106–107.

* cited by examiner

FIG. IA
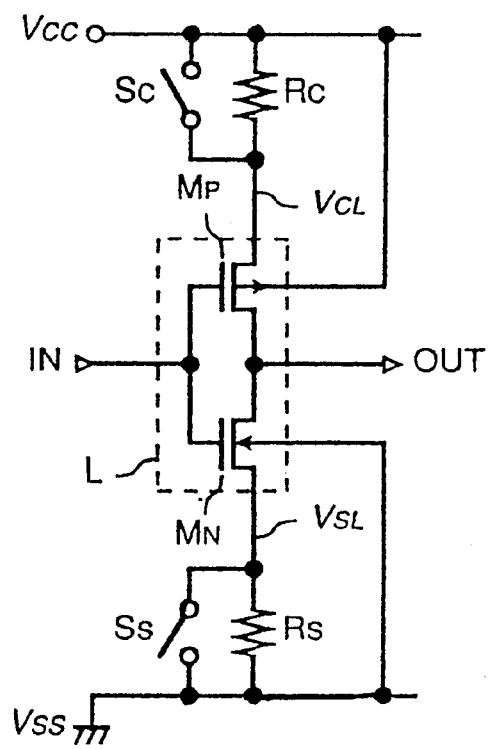
FIG. IB
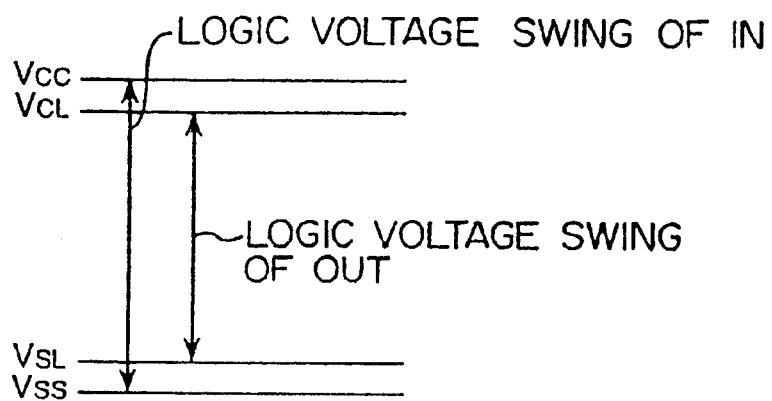

G1, G2, ..., G2k: LOGIC GATE GROUP
GC1, GC2: LEVEL CONVERSION CIRCUIT GROUP

G1, G2, ... ,G2k: LOGIC GATE GROUP
GC1, GC2: LEVEL CONVERSION CIRCUIT GROUP
VC1,VC2,... ,VCk,VS1,VS2, ... ,VSk: VOLTAGE LIMITER

PRIOR ART

PRIOR ART

SEMICONDUCTOR INTEGRATED CIRCUIT DEVICE HAVING POWER REDUCTION MECHANISM

This is a continuation application of U.S. Ser. No. 09/123,480, filed Jul. 28, 1998, which is a continuation application of U.S. Ser. No. 08/653,248, filed May 24, 1996 (now U.S. Pat. No. 5,828,235), which is a continuation application of U.S. Ser. No. 08/193,765, filed Feb. 8, 1994 (now U.S. Pat. No. 5,583,457), which is a Continuation-In-Part of U.S. patent application Ser. No. 08/045,792, filed Apr. 14, 1993 abandoned.

BACKGROUND OF THE INVENTION

The present invention relates to a semiconductor integrated circuit composed of scaled MOS transistors, and more particularly to a circuit suitable for high-speed and low power operation and an electronic device using the same.

As the size of MOS transistors is scaled down, the breakdown voltage thereof is lowered as stated, for example, in the 1989 International Symposium on VLSI Technology, Systems and Applications, Proceedings of Technical Papers, pp. 188–192 (May 1989). Accordingly, the operating voltage thereof has to be lowered. In particular, the operating voltage is lowered even more for the purpose of achieving low power consumption for semiconductor devices used in a battery-operated portable equipment and the like.

SUMMARY OF THE INVENTION

It is an object of the present invention to provide a semiconductor integrated circuit capable of operating at high speed and with low power consumption even when the size of MOS transistors is scaled down.

It is another object of the present invention to provide an electronic device capable of operating at high speed and with low power consumption and suitable for being battery powered drive even when the size of MOS transistors is scaled down.

To decrease power consumption for an integrated circuit having MOS transistors, it is necessary to lower the threshold voltage $V_T$ of the transistor in accord with the lowering of the operating voltage in order to maintain a high-speed operation. This is due to the fact that the operating speed is governed by the effective gate voltage of the MOS transistor, i.e., a value obtained by subtracting $V_T$ from the operating voltage, and the larger this value becomes, the higher the speed becomes. For example, a typical value of a threshold voltage of a transistor having a channel length of 0.25 $\mu$m and operating at 1.5 V is anticipated to be 0.35 V according to the-above-mentioned document. According to a well-known scaling law, the typical value of the threshold voltage becomes approximately 0.24 V when it is assumed that the operating voltage is 1 V. If $V_T$ is brought down to approximately 0.4 V or lower, however, it becomes no longer possible to turn the transistor completely off and a D.C. current starts to flow through it due to the sub-threshold characteristics (tailing characteristics) of the MOS transistor as described hereafter. Thus, this current becomes a serious issue in the practical operation of a device having MOS transistors at 1.5 V or lower.

A conventional CMOS inverter shown in FIG. 49 will be described. Ideally, an N-channel MOS transistor $M_N$ is turned off when an input signal IN is at a low level (=$V_{SS}$), and a P-channel MOS transistor $M_P$ is turned off when IN is at a high level (=$V_{CC}$) thus no current flows in either case. When $V_T$ of the MOS transistor becomes low, however, the subthreshold current can no longer be disregarded.

As shown in FIG. 50, a drain current $I_{DS}$ in a subthreshold region is in proportion to an exponential function of a gate-source voltage $V_{GS}$ and is expressed by the following expression.

$$I_{DS} = I_o \cdot \frac{W}{W_O} \cdot 10^{\frac{V_{GS}-V_T}{S}} \qquad (1)$$

Where, W indicates a channel width of the MOS transistor, $I_O$ and $W_O$ indicate a current value and a channel width when $V_T$ is defined, and S indicates a subthreshold swing (the gate-voltage swing needed to reduce the current by one decade). Thus, a subthreshold current:

$$I_L = I_o \cdot \frac{W}{W_o} \cdot 10^{-\frac{V_T}{S}} \qquad (2)$$

flows even when $V_{GS}$=0. Since $V_{GS}$=0 in the transistor in an off-state of the CMOS inverter shown in FIG. 49, the current $I_L$ mentioned above will flow from the high power supply voltage $V_{CC}$ toward the low power supply voltage $V_{SS}$ which is at ground potential, even at the time of non-operation.

This subthreshold current increases exponentially from $I_L$ to $I_L'$ when the threshold voltage is lowered from $V_T$ to $V_T'$ as shown in FIG. 50.

As is apparent from the above expression (2), it is sufficient either to increase $V_T$ or to decrease S in order to reduce the subthreshold current. However, the former method brings about a lowering of the speed due to a lowering of the effective gate voltage. In particular, when the operating voltage is lowered with the scale-down of the breakdown voltage, the decrease in speed becomes notable and the advantages of scaled down fabrication can no longer be put to practical use, which is not preferable. Further, the latter method is difficult to apply for room temperature operation because of the following reasons.

The subthreshold swing S is expressed by the capacitance $C_{OX}$ of a gate insulator and the capacitance $C_D$ of a depletion layer under the gate as follows.

$$S = \frac{kT \ln 10}{q}\left[1 + \frac{C_D}{C_{OX}}\right] \qquad (3)$$

Where, k indicates the Boltzmann constant, T indicates absolute temperature, and q indicate the elementary charge. As is apparent from the above expression, $S \geq kT \ln 10/q$ irrespective of $C_{OX}$ and $C_D$, thus it is difficult to bring it to 60 mV or lower at room temperature.

The substantial D.C. current of a semiconductor integrated circuit composed of a plurality of MOS transistors increases remarkably due to the phenomenon described above. Namely, since $V_T$ has to be made lower as the operating voltage is lowered at a constant operating speed, the situation becomes more serious when the operation is performed at a lower voltage. At the time of operation at a high temperature in particular, $V_T$ becomes lower and S becomes larger. Therefore, this problem becomes even more serious. In the times of downsizing of computers or the like for the future when low power consumption is important, the increase of the subthreshold current is a substantial issue. In particular, in an electronic device which is desired to be operated by one power cell of a level of 0.9 to 1.6 V, it is also very important to cope with the increase of the current.

In order to solve the above-described problems, according to the present invention, control circuit means for controlling the supply of a large current and a small current is inserted between the source of a MOS transistor and the power supply so as to apply a current to the MOS transistor circuit by switching these currents in accordance with their use. For example, a large current is supplied when high-speed operation is required, and a small current is supplied when low power consumption is required.

Since high-speed operation is required at time of normal operation, a large current is supplied to the MOS transistor circuit from the current supply means so as to make high-speed operation possible. At this time, a D.C. current flows in the MOS transistor circuit as described previously, which, however, is sufficiently small normally as compared with the operating current, i.e., charging and discharging current of a load, thus causing no problem.

On the other hand, since low power consumption is required at the time of standby, the supplied current is changed over to a small current so as to restrain the subthreshold current. At this time, a logic voltage swing of a MOS transistor circuit generally may become smaller than that at the time of supplying a large current because the current is limited, but there is no problem in so far as ensuring the logic level.

As described above, it is possible to realize a high-speed and low power consuming MOS transistor circuit and an electronic device composed of the same according to the present invention.

Besides, the present invention has been described with a MOS semiconductor integrated circuit device as an example, but the present invention is applicable to a metal insulator semiconductor (MIS) integrated circuit device in general.

BRIEF DESCRIPTION OF THE DRAWINGS

FIG. 1A is a diagram showing an inverter in an embodiment 1 of the present invention;

FIG. 1B is a diagram showing the voltage levels of signals of the inverter in the embodiment 1;

DESCRIPTION OF THE PREFERRED EMBODIMENTS

Specific embodiments of the present invention will be described in more detail hereinafter with reference to the drawings.

Embodiment 1

First, FIGS. 1A and 1B show an embodiment suitable for explaining a principle of the present invention.

FIG. 1A is a circuit diagram of an inverter according to an embodiment of the present invention. In FIG. 1A, L represents a CMOS inverter, which is composed of a P-channel MOS transistor $M_P$ and an N-channel MOS transistor $M_N$. The present invention is applicable not only to an inverter, but also to a logic gates such as NAND and NOR circuits or to a logic gate group as described later. However, a case of an inverter will be described herein for the sake of simplicity. $S_C$ and $S_S$ represent switches and $R_C$ and $R_S$ represent resistances. In the present embodiment, switches $S_C$ and $S_S$ and resistances $R_C$ and $R_S$ are inserted in parallel between power supply terminals $V_{CL}$ and $V_{SL}$ of an inverter L and power supplies $V_{CC}$ and $V_{SS}$, respectively. With this arrangement, subthreshold current reduction is realized as described hereinafter.

In a period where high-speed operation is required, the switches $S_C$ and $S_S$ are switched on, and $V_{CC}$ and $V_{SS}$ are applied directly to the inverter L (hereinafter referred to as a high-speed operation mode). High-speed operation can be performed if threshold voltages $V_T$ of $M_P$ and $M_N$ are set low. At this time, a subthreshold current flows in the inverter L as described previously, which, however, causes no problem since the current is normally sufficiently small as compared with an operating current, i.e., charging and discharging current of a load.

Figure 2:
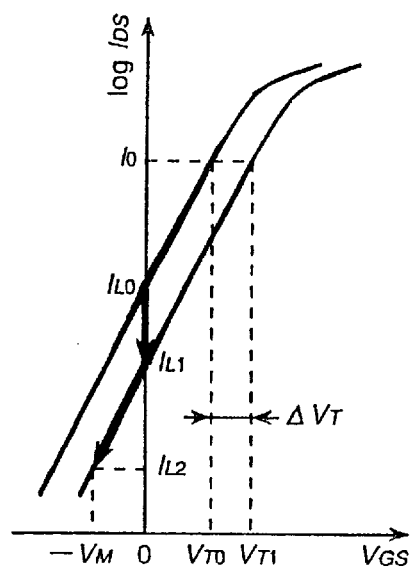
FIG. 2 is a diagram showing a principle of subthreshold current reduction according to the present invention.

On the other hand, in a period where low power consumption is required, the switches $S_C$ and $S_S$ are switched off and power is supplied to the inverter through the resistances $R_C$ and $R_S$ (hereinafter referred to as a low power consumption mode). As a result of the voltage drop due to the fact that the subthreshold current flows through resistances, $V_{CL}$ drops lower than $V_{CC}$ and $V_{SL}$ rises higher than $V_{SS}$. As shown in FIG. 2, the subthreshold current decreases due to the voltage drop by means of the following two types of mechanisms. Incidentally, the following description is given for $M_N$ when an input signal IN is at a low level ($V_{SS}$), but the same description applies to $M_P$ when IN is at a high level ($V_{CC}$).

(i) Since the source potential $V_{SL}$ rises, backgate bias $V_{BS}=V_{SS}-V_{SL}=-V_M$ is applied, and the threshold voltage rises from $V_{T0}$ to $V_{T1}$. The rise portion of the threshold voltage is expressed as:

$$\Delta V = V_{T1} - V_{T0} = K(\sqrt{V_M + 2\Psi} - \sqrt{2\Psi}) \qquad (4)$$

With this, the subthreshold current decreases from $I_{L0}$ to $I_{L1}$. The rate of decrease is:

$$\frac{I_{L1}}{I_{L0}} = 10^{-\frac{\Delta V_T}{S}} = 10^{-\frac{K(\sqrt{V_M+2\Psi}-\sqrt{2\Psi})}{S}} \qquad (5)$$

Where, K is a body effect factor. For example, when $V_M$=0.3 V, K=0.4 $\sqrt{V}$, S=100 mV/decade and 2Ψ=0.64 V, the subthreshold current is reduced to 21%.

(ii) Since a source potential $V_{SL}$ rises, the gate-source voltage $V_{GS}=V_{SS}-V_{SL}=-V_M$ becomes negative. With this, the subthreshold current decreases further from $I_{L1}$ to $I_{L2}$. The rate of decrease is:

$$\frac{I_{L2}}{I_{L1}} = 10^{-\frac{V_M}{S}} \qquad (6)$$

For example, when VM=0.3 V and S=100 mV/decade, the subthreshold current is reduced to 0.1%.

When the effects of (i) and (ii) are put together, the following expression is obtained.

$$\frac{I_{L2}}{I_{L0}} = 10^{-\frac{V_M+K(\sqrt{V_M+2\Psi}-\sqrt{2\Psi})}{S}} \qquad (7)$$

For example, when $V_M$=0.3 V, the subthreshold current is reduced to 0.02%. Where, $V_M$ represents the solution of the following equation.

$$V_M = R_S \cdot I_o \cdot \frac{W}{W_o} \cdot 10^{-\frac{V_M+V_{T0}+K(\sqrt{V_M+2\Psi}-\sqrt{2\Psi})}{S}} \qquad (8)$$

Incidentally, the back gates of the MOS transistors $M_P$ and $M_N$ of the inverter L may be connected to respective sources $V_{CL}$ and $V_{SL}$, but it is more desirable to connect the back gates to $V_{CC}$ and $V_{SS}$ as shown in FIG. 1A in order to obtain the effect (i) identified above.

Figure 3:
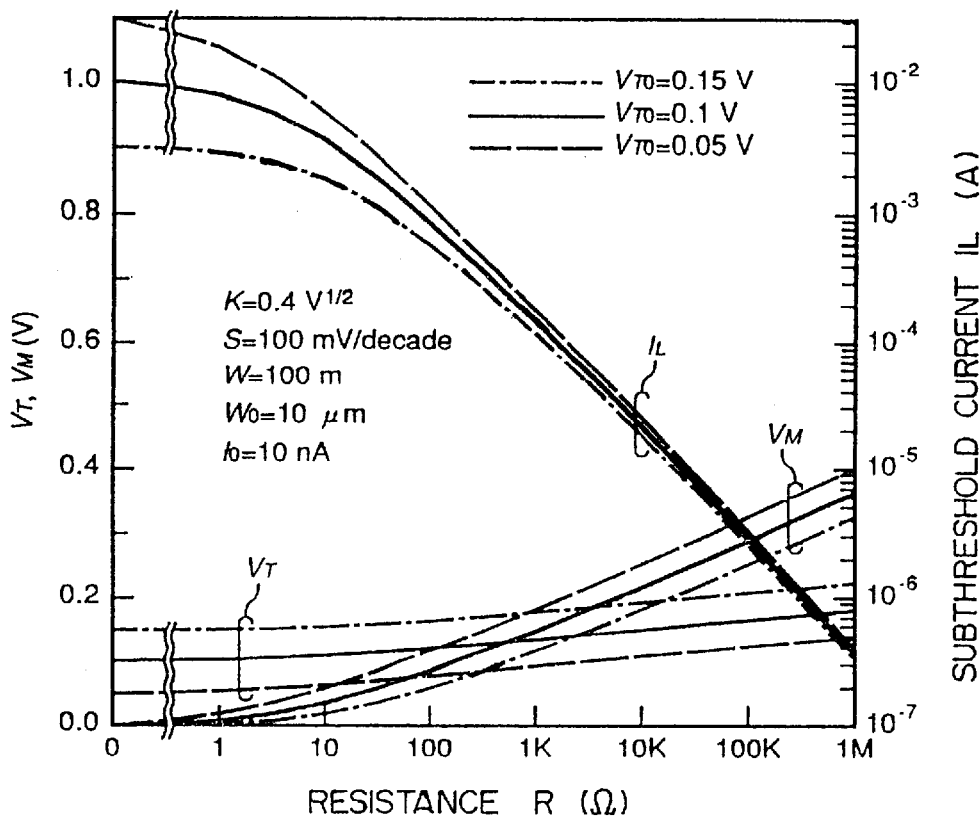
FIG. 3 is a diagram showing the subthreshold current reduction effect according to the present invention.

FIG. 3 shows a subthreshold current reduction effect. Here, a future very large scale LSI operating at an ultra low voltage is assumed, and computation is made with respect to a case that a threshold voltage $V_{TO}$=0.05 to 0.15 V when the back gate bias is 0 and the sum total W of the channel widths of transistors in an off state in the whole LSI is W=100 m. The more the resistance is increased, the larger $V_M$ becomes, thus increasing the effect. As an extreme case, it is also possible to make the resistance infinite, i.e., to remove the resistance.

However, as shown in FIG. 1B, the logic voltage swing of the output signal OUT becomes smaller than the logic voltage swing of the input signal IN. Accordingly, consideration of voltage levels of the signals in the case of a multistage connection must be taken into account and such a case will be described later.

Further, the present invention has a function of compensating fluctuation of the threshold voltage automatically. Namely, when the threshold voltage is low and the subthreshold current is large, the voltage drop $V_M$ becomes larger, and, when the threshold voltage is high and the subthreshold current is small, $V_M$ becomes smaller. In either case, the fluctuation of the current is restrained. As is apparent from FIG. 3, the fluctuation of the subthreshold current is smaller as the resistance value becomes larger. For example, when the resistance value is set to 3 KΩ or more, the fluctuation of the subthreshold current $I_L$ is restrained within ±20% even if the threshold voltage fluctuates by ±0.05 V.

Embodiment 2

Figure 4:
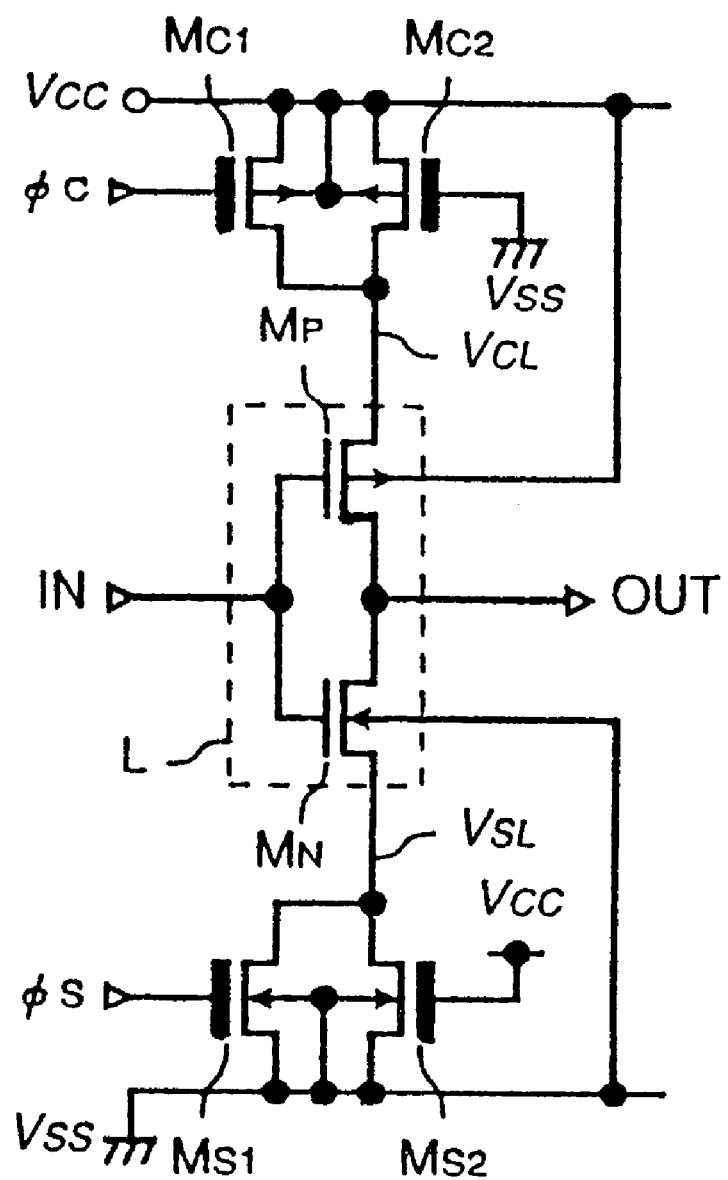
FIG. 4 is a circuit diagram showing an inverter in an embodiment 2 of the present invention.

Next, a specific method for realizing a switch and a resistance explained in the embodiment 1 will be described. FIG. 4 shows an example in which both the switch and the resistance are realized by MOS transistors.

Switching MOS transistors $M_{C1}$ and $M_{S1}$ are those that have large conductance, and correspond to the switches $S_C$ and $S_S$ shown in FIG. 1A, respectively. In a high-speed operation mode, $M_{C1}$ and $M_{S1}$ are turned on by bringing a signal $\phi_C$ to a low level and $\phi_S$ to a high level. The voltage levels of $\phi_C$ and $\phi_S$ may be $V_{SS}$ and $V_{CC}$, respectively, but it may also be arranged so that $\phi_C$ is set lower than $V_{SS}$ and $\phi_S$ is set higher than $V_{CC}$ in order to make the conductances of $M_{C1}$ and $M_{S1}$ larger. It is sufficient to apply the voltages for the above from the outside of a chip or to generate the same by an on-chip booster circuit well known in an EEPROM and a DRAM.

In a low power consumption mode, $M_{C1}$ and $M_{S1}$ are turned off by bringing $\phi_C$ to a high level and $\phi_S$ to a low level conversely to the above. At this time, the current is cut off by one of two methods, for example. In a first method, $\phi_C$ is made lower than $V_{SS}$ by means of the external voltage or the on-chip booster circuit. In a second method, transistors having threshold voltages higher (more enhanced) than those used in the inverter L are used as $M_{C1}$ and $M_{S1}$. The first method has such a merit that the process for producing transistors having different threshold voltages is unnecessary. On the other hand, the second method is advantageous since the implementation area does not require terminals for receiving external voltages or an on-chip booster circuit.

MOS transistors $M_{C2}$ and $M_{S2}$ are those that have small conductance, and correspond to the resistances $R_C$ and $R_S$ shown in FIG. 1A, respectively. These transistors are connected to $V_{SS}$ and $V_{CC}$ at the gate thereof, respectively, and are always in an on-state. Since it is not required to turn off these transistors, there is no problem even if the threshold voltages thereof are low.

Incidentally, it is also possible to use an N-channel MOS transistor as $MC_2$ and a P-channel MOS transistor as $M_{S2}$. For example, taking an N-channel MOS transistor of $MC_2$ as an example, a resistance can be realized effectively by what is called a diode connection in which a terminal connected with the gate and the drain thereof is connected to the terminal $V_{CC}$, and the source thereof is connected to the terminal $V_{CL}$. By controlling the channel width and the threshold voltage of the N-channel MOS transistor, the voltage $V_{CL}$ can be set to a voltage dropped from $V_{CC}$ by the threshold voltage of the N-channel MOS transistor at the time of standby for instance, thus making it possible to reduce the subthreshold current with a large margin.

Figure 5A:
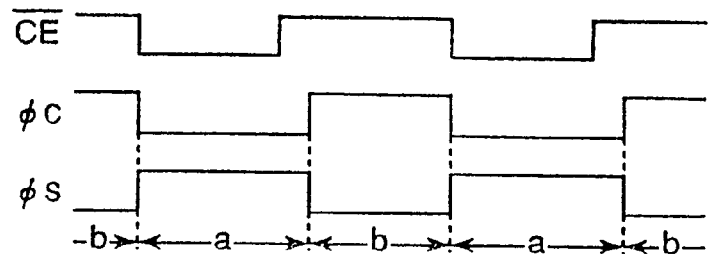
FIGS. 5A to 5C are diagrams showing the timing of signals of the present invention.
Figure 5B:
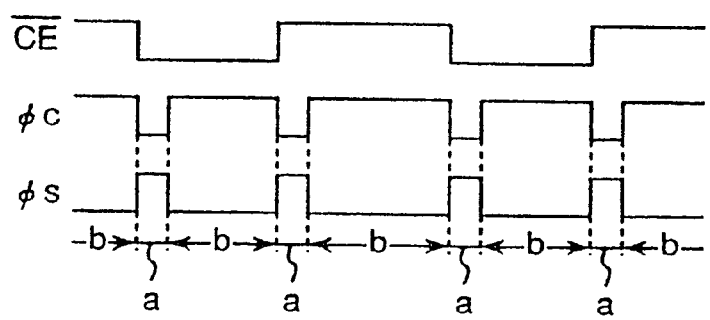
Figure 5C:
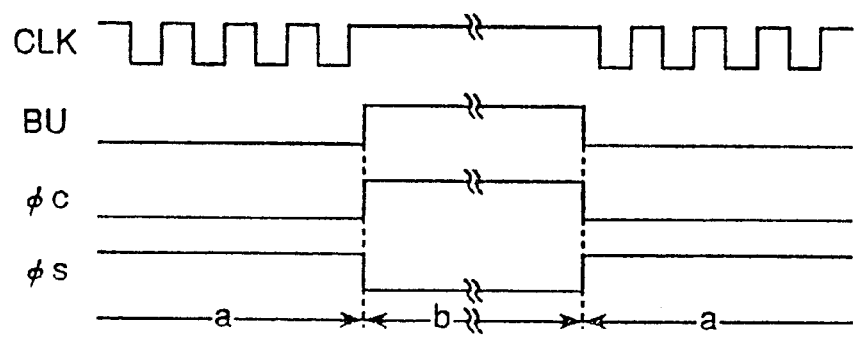

Next, an example of an application of the timing to be used with the present invention will be described. FIGS. 5A to 5C show examples of the timing of signals $\phi_C$ and $\phi_S$.

FIG. 5A and FIG. 5B show applications where the present invention is applied to a memory LSI. The memory LSI is brought into an operating state when a chip enable signal $\overline{CE}$ (a complementary signal), which is a clock signal from the outside, is at a low level, and a standby state when the signal $\overline{CE}$ is at a high level. In the case of FIG. 5A, an internal signal $\phi_C$ is brought to a low level synchronously with the fall of $\overline{CE}$ and brought to a high level slightly behind the rise of $\overline{CE}$. The internal signal $\phi_S$ is opposite thereto. Thus, the period shown at <u>a</u> in the figure becomes the high-speed operation mode, and the period <u>b</u> becomes the low power consumption mode. Generally, in a memory unit using a plurality of memory LSIs, LSIs in the operating state are small in number, and a large majority of LSIs are in the standby state. Accordingly, when those LSIs that are in the standby state are brought into a low power consumption state using the present invention, it contributes greatly to obtaining a low power consumption of a memory unit. Besides, the reason for providing delay from the rise of $\overline{CE}$ until entering into the low power consumption mode is that an internal circuit of the LSI is reset in the interim.

FIG. 5B shows an example in which further low power consumption is achieved. Here, only immediately after $\overline{CE}$ has changed is the LSI operation period brought into the high-speed operation mode. Namely, read-write of data are performed immediately after $\overline{CE}$ is brought to a low level, and the internal circuit is reset immediately after $\overline{CE}$ is brought to a high level. Therefore, these LSI operation periods are brought into the high-speed operation mode according to the present invention, and other LSI operation periods are brought into the low power consumption mode according to the present invention. Alternatively, the high-speed operation mode may be entered into when an address signal changes.

FIG. 5C shows an example in which the present invention is applied to a microprocessor. A clock signal CLK is applied in a normal operation state. At this time, the signal $\phi_C$ is at a low level and $\phi_S$ is at a high level, presenting the high-speed operation mode. When the microprocessor is brought into a standby state or a data holding state, the clock signal CLK is suspended, and a signal BU is brought to a high level. $\phi_C$ shows the high level and $\phi_S$ shows the low level synchronously with the above, presenting the low power consumption mode. With this, the power consumption of the microprocessor is reduced, thus making it possible to operate the microprocessor in a backup mode for a long period of time with a power supply of small capacity, such as a battery.

Figure 6:
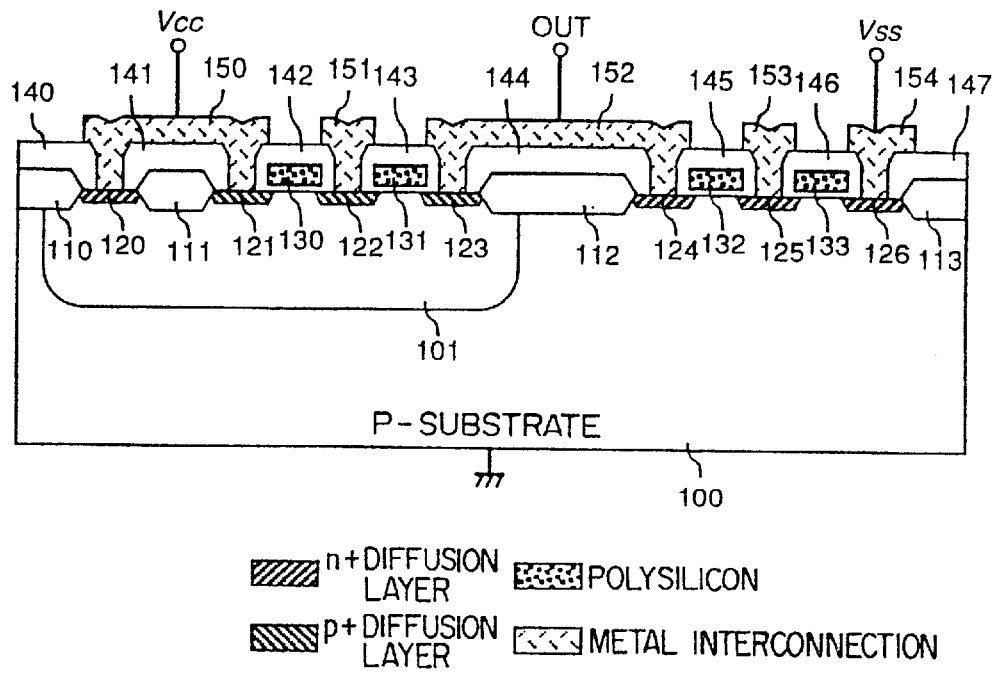
FIG. 6 is a diagram showing a device structure of the present invention.

FIG. 6 shows an example of a device having a semiconductor structure for realizing the circuit shown in FIG. 4. Polysilicon 130, 131, 132 and 133 in the figure correspond to gates of $M_{C2}$, $M_P$, $M_N$ and $M_{S2}$ shown in FIG. 4, respectively ($M_{C1}$ and $M_{S1}$ are not shown here).

It is to be noted that $M_{C2}$ and $M_P$ hold a same n-well 101 which is connected to $V_{CC}$ through an n+ diffusion layer 120 in common. $M_N$ and $MS_2$ also hold a p-substrate connected to $V_{SS}$ in common in a similar manner as above. As it is understood from the foregoing, it not only produces the effect (i) described heretofore, but also produces a more advantageous layout area to connect the back gates of the MOS transistors to $V_{CC}$ and $V_{SS}$ as compared with connection of the same to the sources.

Although an n-well is formed in a p-substrate in the example shown here, a p-well may also be formed in an n-substrate conversely to the above. Otherwise, a triple well structure such as described in the ISSCC Digest of Technical Papers, pp. 248–249, February 1989 may also be adopted.

Embodiment 3

Figure 7:
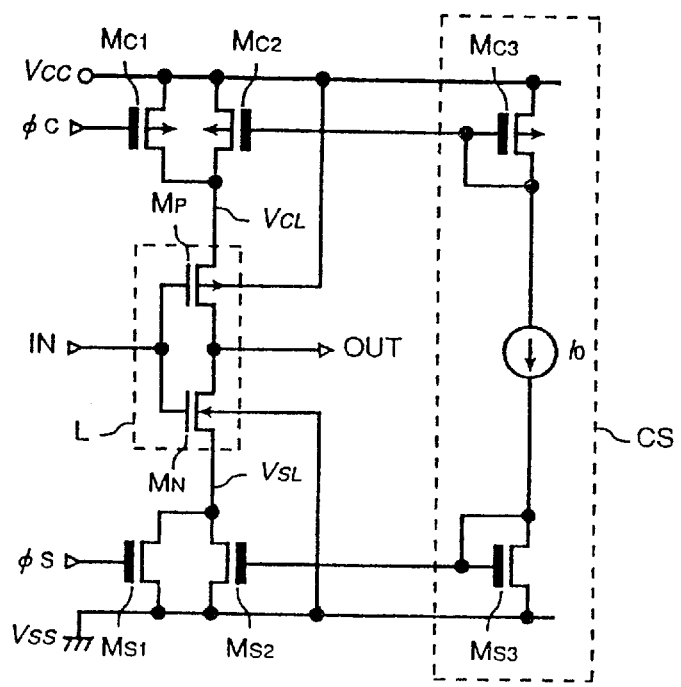
FIG. 7 is a circuit diagram of an inverter in an embodiment 3 of the present invention.

FIG. 7 shows another method for realizing a switch and a resistance. The feature of the present embodiment is to use a current mirror circuit. Namely, MOS transistors $M_{C2}$ and $M_{C3}$ having the same threshold voltage form what is called a current mirror circuit, and when a current in proportion to a current source $I_0$ flows in $M_{C2}$ the impedance thereof is large. The same is also applied to $M_{S2}$ and $M_{S3}$. Thus, $M_{C2}$ and $M_{S2}$ may be regarded as having high resistance. Besides, a circuit CS composed of the current source $I_0$ and $M_{C3}$ and $M_{S3}$ may be held in common by a plurality of logic gates.

The current mirror circuit is not limited to the circuit illustrated there, but also another circuit may be adopted. For example, a bipolar transistor may be used in place of the MOS transistor.

As described, various modifications are possible for the method for realizing a switch and a resistance. In a word, any means for applying a large current in a period where high-speed operation is required and for applying a small current in a period where low power consumption is required will suffice. The drawings will be illustrated with switches and resistances hereinafter as shown in FIG. 1 for the sake of simplicity.

Embodiment 4

Figure 8:
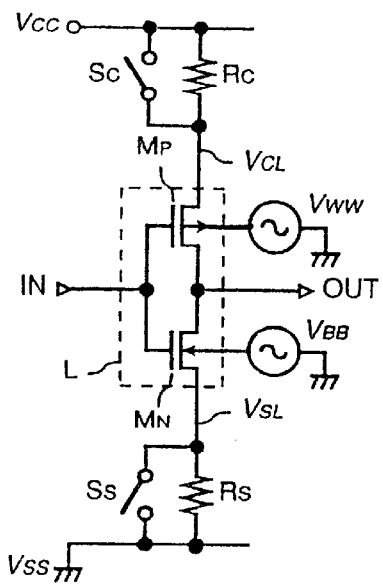
FIG. 8 is a circuit diagram of an inverter in an embodiment 4 of the present invention.

The backgates of the MOS transistors of the inverter may be connected to other power supplies not limiting to $V_{CC}$ and $V_{SS}$, and the voltages thereof may also be made variable. An example is shown in FIG. 8. The back gates of $M_P$ and $M_N$ are connected here to power supplies $V_{WW}$ and $V_{BB}$, respectively, and backgate voltage values thereof are changed depending on time of operation and time of standby. As to $V_{BB}$, in the period where high-speed operation is required, $V_{BB}$ is made shallow (or slightly positive in an extreme case), and $V_T$ of $M_N$ is lowered so as to make high-speed operation possible. In the period where low power consumption is required, $V_{BB}$ is made deep and $V_T$ of $M_N$ is raised, thereby to restrain the subthreshold current. With this, the effect (i) described previously is increased further. $V_{BB}$ has been described above, but the same is applied to $V_{WW}$ except that the polarity of the voltage is reversed. Incidentally, a back gate voltage generating circuit of this sort is described in ISSCC Digest of Technical Papers, pp. 254–255, February 1985.

Figure 9:
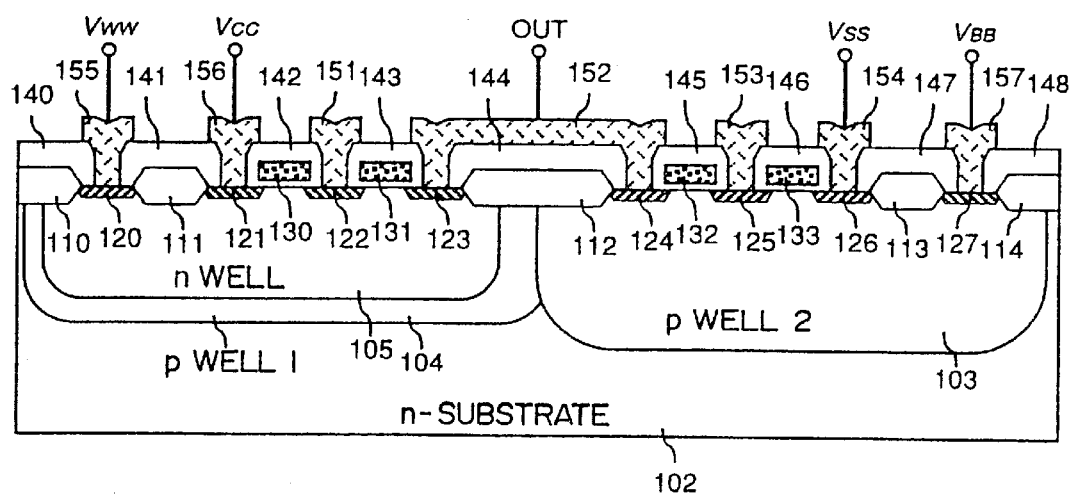
FIG. 9 is a diagram showing a device structure of the present invention.

FIG. 9 shows an example of a device structure for realizing the circuit shown in FIG. 8. The triple well structure described previously is used here, in which an n-well 105 (a backgate of the P-channel MOS transistors) is connected to $V_{WW}$ through an n+ diffusion layer 120, and a p-well well 103 (a backgate of the N-channel MOS transistors) is connected to $V_{BB}$ through a p+ diffusion layer 127.

This triple well structure has such an advantage that the backgate voltage can be set for every circuit because both the P-channel and the N-channel transistors can be incorporated in respective wells for every circuit. For example, when a circuit in an operating state and a circuit in a standby state are included in one LSI, it is possible to make the backgate voltage of the former shallow and the backgate voltage of the latter deep.

Embodiment 5

Next, a case of an inverter chain in which inverters are connected successively will be described. The principle will be described with respect to a case of two stages first for the sake of simplicity.

Figure 10A:
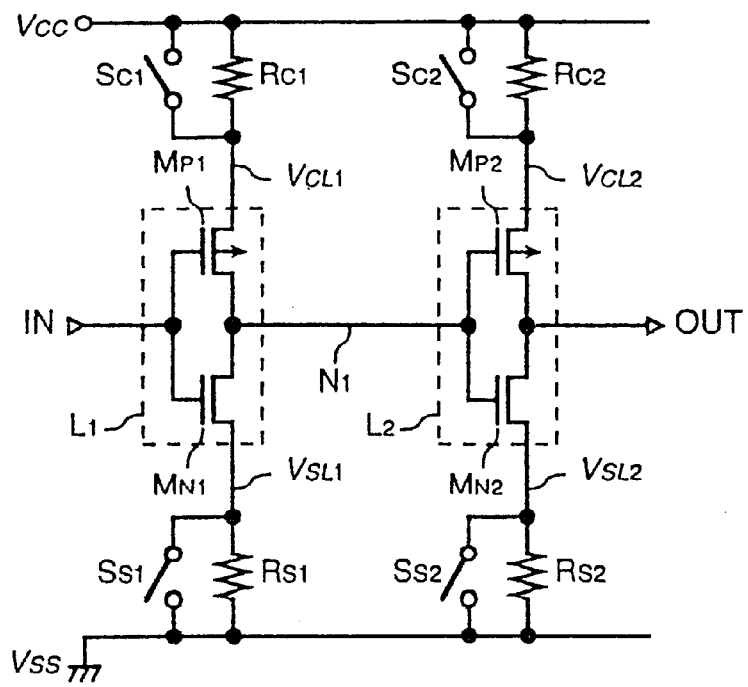
FIG. 10A is a diagram showing an inverter chain in an embodiment 5 of the present invention.

FIG. 10A shows a circuit diagram for CMOS inverters $L_1$ and $L_2$. Switches $S_{Ci}$ and $S_{Si}$ and resistances $R_{Ci}$ and $R_{Si}$ (i=1,2) are provided for each inverter at every stage.

In the high speed operation mode, all four switches are switched on, and $V_{CC}$ and $V_{SS}$ are applied directly to the inverters $L_1$ and $L_2$. High-speed operation is made possible by setting the threshold voltages of the MOS transistors of the inverters low. On the other hand, in the low power consumption mode, all of the switches are switched off, and the power is supplied to the inverters through resistances. Voltages $V_{CL1}$ and $V_{CL2}$ fall lower than $V_{CC}$, and voltages $V_{SL1}$ and $V_{SL2}$ rise higher than $V_{SS}$ by voltage drops due to the fact that the subthreshold current flows through the resistances.

As to the inverter $L_1$ at the first stage, the subthreshold current decreases by the mechanisms described previously (effects (i) and (ii)) in a similar manner as to the case of FIG. 1. However, the logic voltage swing of the output $N_1$ of $L_1$ is smaller than the logic voltage swing of the input signal IN. Namely, the voltage level of $N_1$ shows $V_{CL1}$ when IN is at a low level (=$V_{SS}$) and the voltage level of $N_1$ shows $V_{SL1}$ when IN is at a high level (=$V_{CC}$). Since $N_1$ is the input to the inverter $L_2$ at the second stage, it is desirable to set the resistance values so that $V_{CC}>V_{CL1}>V_{CL2}$ and $V_{SS}<V_{SL1}<V_{SL2}$ are effected for the subthreshold current reduction of $L_2$. With this, the subthreshold current decreases by the mechanisms described previously (effects (i) and (ii)) with respect to $L_2$, too. When $V_{CL1}=V_{CL2}$ and $V_{SL1}=V_{SL2}$, the effect (i) is obtainable, but the effect (ii) is not obtainable.

Embodiment 6

Figure 11A:
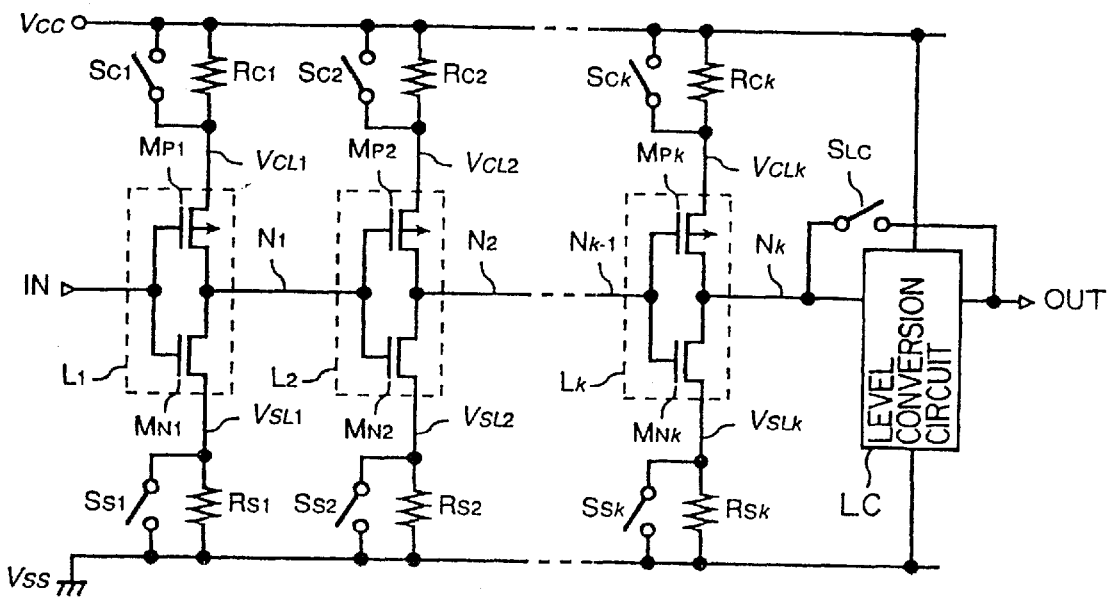
FIG. 11A is a diagram showing an inverter chain in an embodiment 6 of the present invention.
Figure 11B:
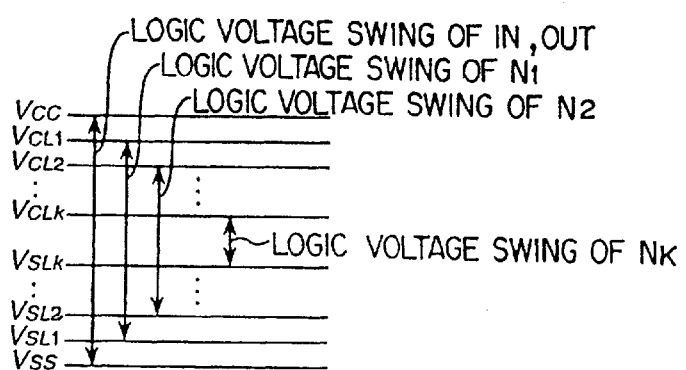
FIG. 11B is a diagram showing voltage levels of signals of the inverter chain in the embodiment 6.

The same embodiment is also applied to a multistage connection shown in FIG. 11A, and it is recommended to effect $V_{CC}>V_{CL1}>V_{CL2}> \ldots >V_{CLK}$ and $V_{SS}<V_{SL1}<V_{SL2}< \ldots <V_{SLK}$. Since the logic voltage swing becomes smaller step by step as shown in FIG. 11B, however, the voltage-swing is recovered by inserting a level conversion circuit appropriately. In the present example, a level conversion circuit LC is added after the inverter at a Kth stage so that the logic voltage swing of an output signal OUT becomes the same as that of an input signal IN. A level conversion circuit of, this sort is described in Symposium on VLSI Circuits, Digest of Technical Papers, pp. 82–83, June 1992 for instance.

The level conversion circuit LC is not required at the time of high-speed operation. The reason is that, since all the switches are in an on-state, $V_{CL1}=V_{CL2}= \ldots =V_{CLK}=V_{CC}$ and $V_{SL1}=V_{SL2}= \ldots =V_{SLK}=V_{SS}$ and the logic voltage swing is not reduced. Thus, it is possible to avoid the delay by switching the switch $S_{LC}$ on so as to bypass the level conversion circuit at the time of high-speed operation.

Embodiment 7

Figure 10B:
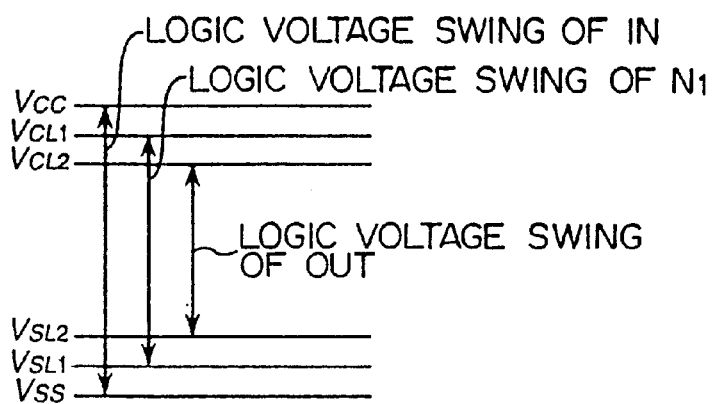
FIG. 10B is a diagram showing voltage levels of signals of the inverter chain in the embodiment 5.
Figure 12A:
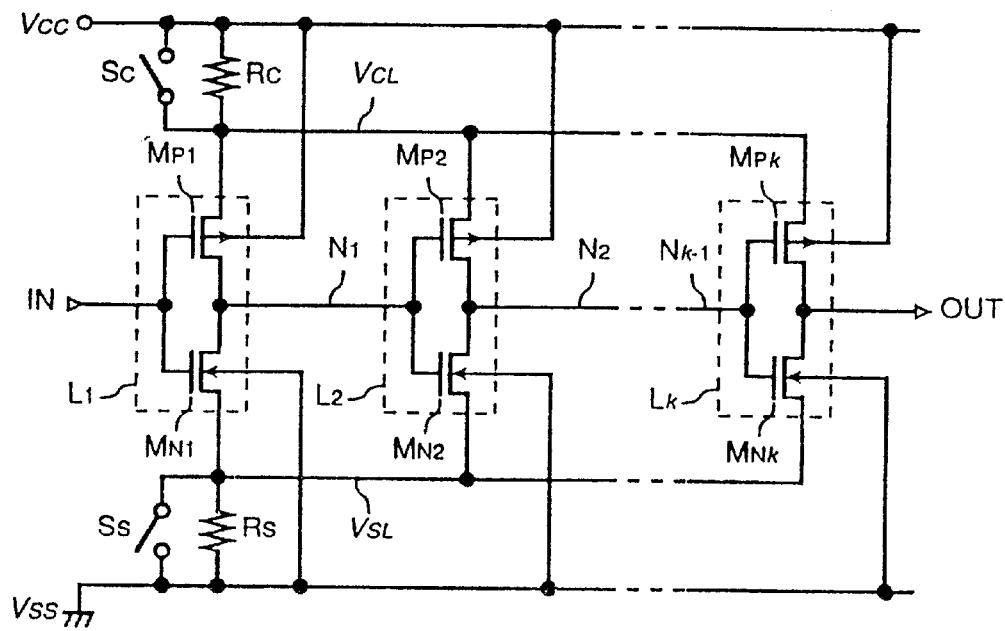
FIG. 12A is a diagram showing an inverter chain in an embodiment 7 of the present invention.

FIG. 12A shows another example of an inverter chain of multistage connection. In the present example, all of switches $S_C$ and $S_S$ and resistances $R_C$ and $R_S$ are held in common by means of the inverters $L_1$ to $L_K$, and the voltages $V_{CL}$ and $V_{SL}$ are common to $L_1$ to $L_K$. Therefore, the subthreshold current reduction effect (i) described previously is obtainable, but the effect (ii) is not obtainable as described with reference to FIG. 10. Thus, the subthreshold current reduction effect becomes smaller than that in the previous embodiment.

Figure 12B:
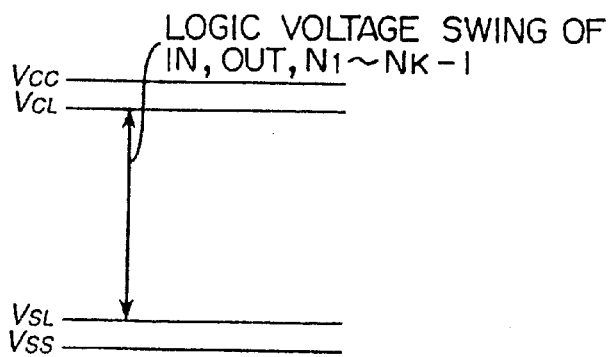
FIG. 12B is a diagram showing voltage levels of signals of the inverter chain in the embodiment 7.

On the other hand, however, there is such an advantage that the layout area of switches and resistances can be saved. Further, there is such a feature that the voltage levels of all the signals including input-output signals are the same and there is no reduction in the logic voltage swing as in the previous embodiment as shown in FIG. 12B. As a result, there is such a merit that the level conversion circuit is not required, and a logic circuit such as a NAND circuit, a NOR circuit or the like is fabricated easily.

Embodiment 8

Next, a case where the present invention is applied to a general combinational logic circuit will be described.

Figure 13:
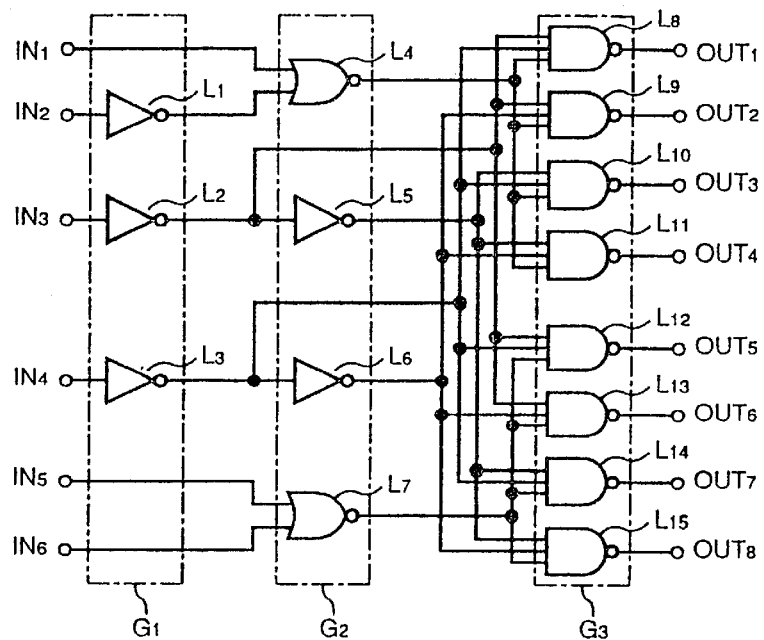
FIG. 13 is a diagram showing an example of a grouping of a combinational logic circuit applied with the present invention.

For example, a combinational logic circuit shown in FIG. 13 is considered. In order to apply the present invention thereto, logic gates are grouped first as shown in FIG. 13. In the present example, 15 pieces of logic gates $L_1$ to $L_{15}$ are divided into three groups $G_1$, $G_2$ and $G_3$. In grouping, it is arranged so that the output signals of logic gates included in the (i)th group are inputted only to logic gates of the (i+1)th group and therafter.

Figure 14:
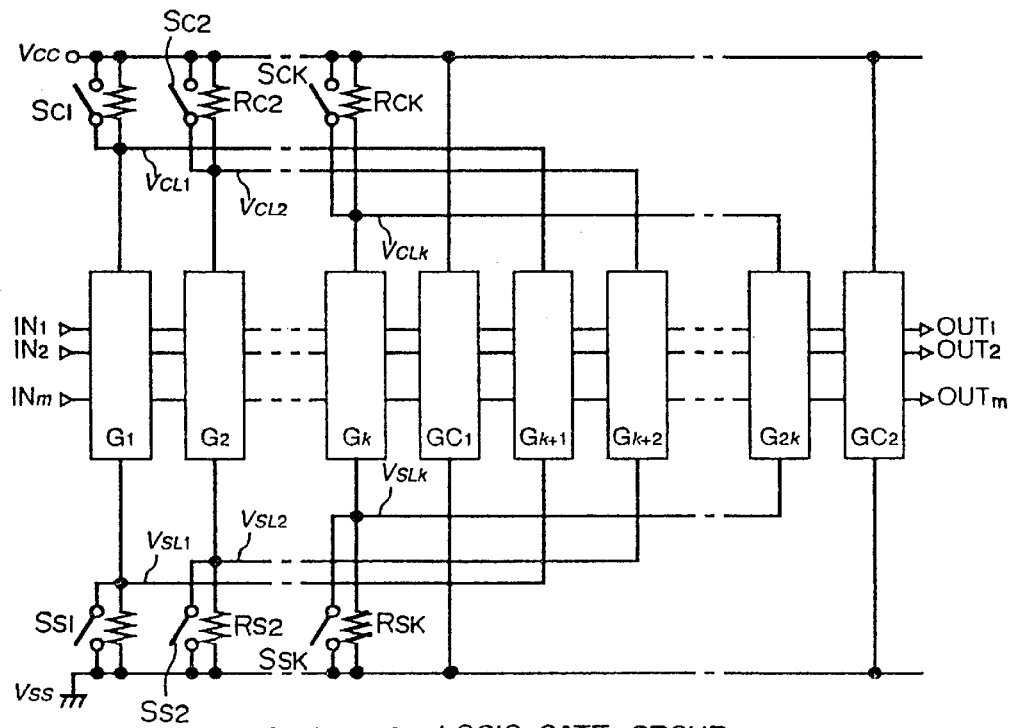
FIG. 14 is a diagram showing a combinational logic circuit in an embodiment 8 of the present invention.

Next, switches and resistances are inserted between each logic gate group and the power supplies as shown in FIG. 14. Since the logic voltage swing of the output signal of the logic gate becomes smaller step by step similarly to the case shown in FIG. 11B, level conversion circuit groups $GC_1$ and $GC_2$ are inserted as shown in FIG. 14 so as to recover the voltage swing. Besides, although it is not illustrated, the level conversion circuit groups $GC_1$ and $GC_2$ may be bypassed at time of high-speed operation similarly to the case of FIG. 11A.

One of the features of the present embodiment is that logic gates included in the same group hold the switch and the resistance in common. Speaking of the example shown in FIG. 13, three inverters included in the group $G_1$ hold the switches $S_{C1}$ and $S_{S1}$ and the resistances $R_{C1}$ and $R_{S1}$ in common.

Another feature of the present embodiment is that the switch and the resistance are held in common by groups before and after the level conversion circuit. Namely, groups $G_1$ and $G_{K+1}$ hold the switches $S_{C1}$ and $S_{S1}$ and the resistances $R_{C1}$ and $R_{S1}$ in common, groups $G_2$ and $G_{K+2}$ hold the switches $S_{C2}$ and $S_{S2}$ and the resistances $R_{C2}$ and $R_{S2}$ in common, and groups $G_K$ and $G_{2K}$ hold the switches $S_{CK}$ and $S_{SK}$ and the resistances $R_{CK}$ and $R_{SK}$ in common, respectively.

It is possible to reduce the number of switches and resistances for the whole LSI so as to reduce the layout area by holding the switches and the resistances in common by a plurality of logic gates as described above.

Embodiment 9

Figure 15:
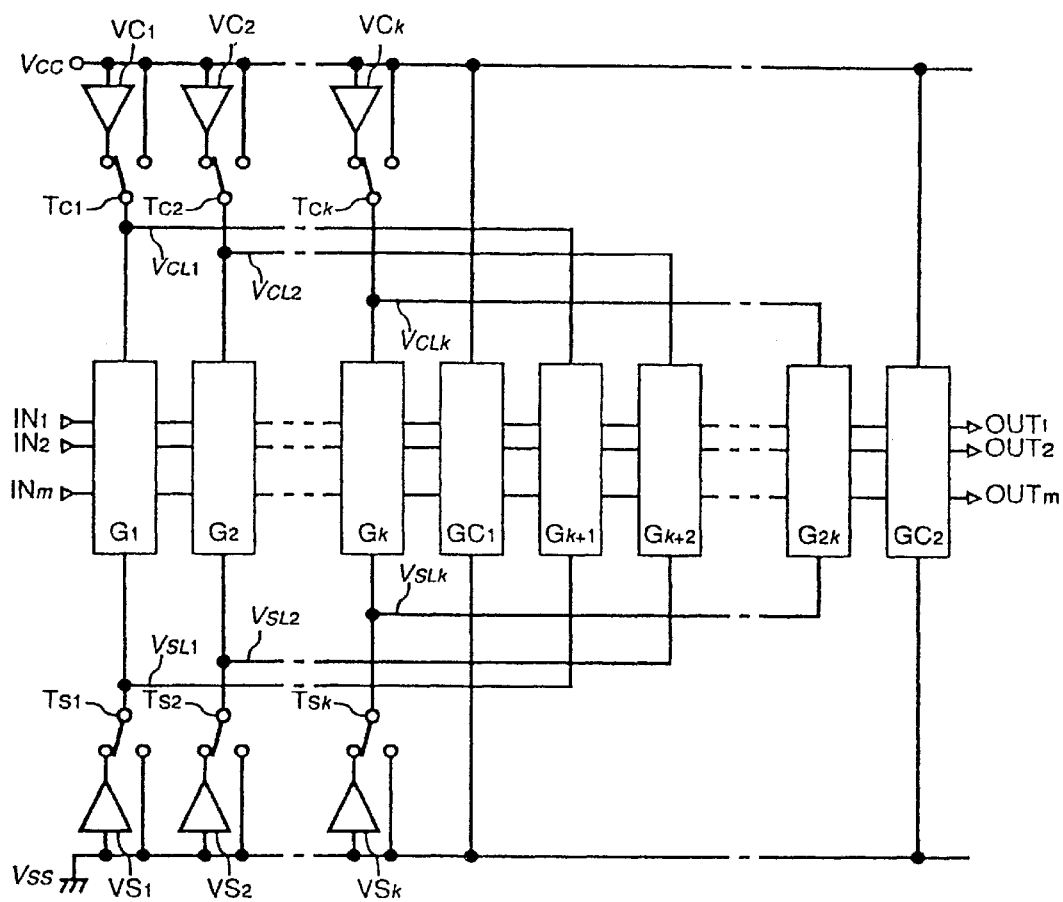
FIG. 15 is a diagram showing a combinational logic circuit in an embodiment 9 of the present invention.

FIG. 15 shows another embodiment of the present invention. What differs from embodiments described up to this point in the embodiment shown in FIG. 15 is that voltage limiters (voltage down converters and voltage up converters) $VC_1$, $VC_2$ ..., $VC_K$ and $VS_1$, $VS_2$, ..., $VS_K$ are used.

When low power consumption is required, switches $T_{C1}$ to $T_{CK}$ and $T_{S1}$ to $T_{SK}$ are changed over to the illustrated sides, and the power is supplied to the logic gate groups by means of voltage limiters. The voltage limiters $VC_1$, $VC_2$, ..., $VC_K$ operate as voltage down converters on the side of the power supply voltage $V_{CC}$, and generate almost stabilized internal voltages $V_{CL1}$, $V_{CL2}$, ... $V_{VCLK}$ lower than $V_{CC}$, respectively. On the other hand, $VS_1$, $VS_2$, ... $VS_K$ operate as voltage up converters on the side of ground $V_{SS}$, and generate almost stabilized internal voltage $V_{SL1}$, $V_{SL2}$, ..., $V_{SLK}$ higher than $V_{SS}$, respectively. It is recommended to effect $V_{CC} > V_{CL1} > V_{CL2} > ... > V_{CLK}$ and $V_{SS} < V_{SL1} < V_{SL2} < ... < V_{SLK}$ for the generated voltages similarly to the embodiment described previously. Incidentally, a voltage limiter of this sort has been disclosed in JP-A-2-246516.

In contrast with the above, when high-speed operation is required, the switches are changed over to the side opposite to that which is illustrated and $V_{CC}$ and $V_{SS}$ are applied directly to the logic gate groups, thus making high-speed operation possible. Besides, since the voltage limiters become unnecessary at this time, the operation may be suspended.

Embodiments 10, 11

Figure 16A:
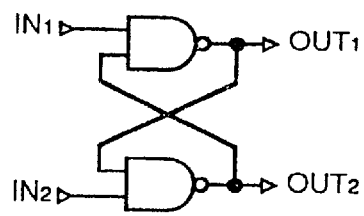
FIGS. 16A and 16B are diagrams showing a latch in an embodiment of the present invention.

The circuits without feedback such as an inverter chain and a combinational logic circuit have been used in the embodiments up to this point, but the present invention is also applicable to a circuit with feedback. A case of a latch circuit obtained by combining two NAND gates shown in FIG. 16A will be described as an example.

Figure 16B:
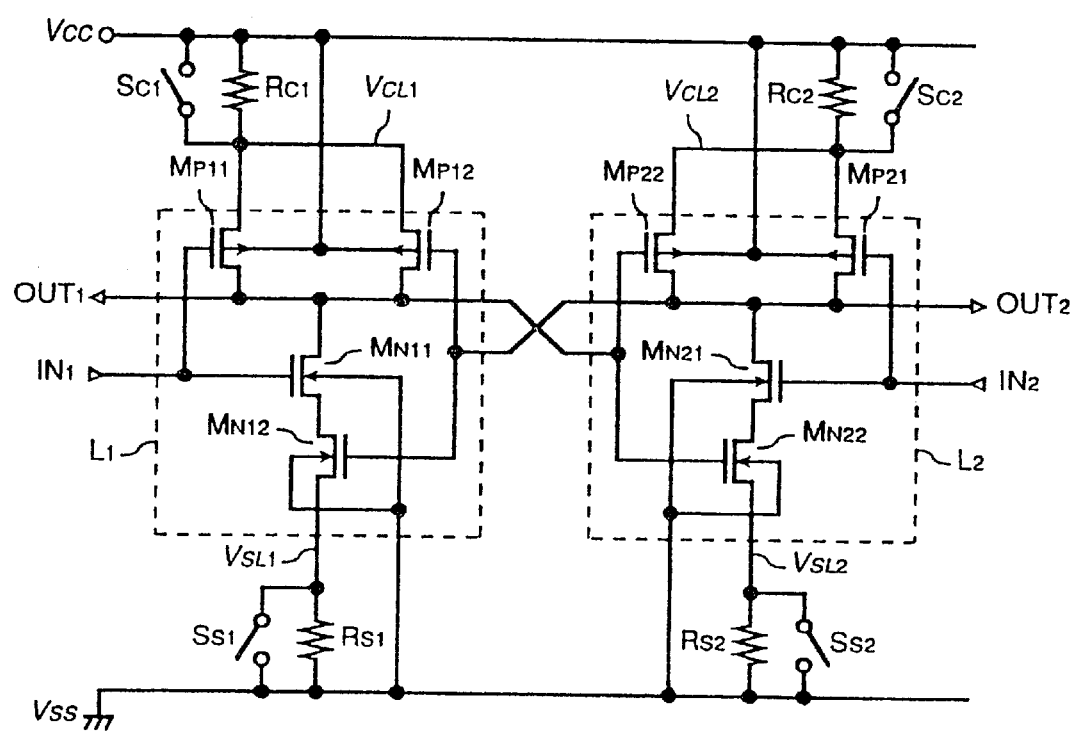

FIG. 16B shows a circuit diagram. Switches $S_{C1}$, $S_{S1}$, $S_{C2}$ and $S_{S2}$ and resistances $R_{C1}$, $R_{S1}$, $R_{C2}$ and $R_{S2}$ are inserted among two NAND gates $L_1$ and $L_2$, the power supply $V_{CC}$ and the ground $V_{SS}$, respectively. $V_{CL1}$ and $V_{CL2}$ fall lower than $V_{CC}$, $V_{SL1}$ and $V_{SL2}$ rise higher than $V_{SS}$, and the subthreshold current is reduced by the effect (i) described previously.

Figure 17:
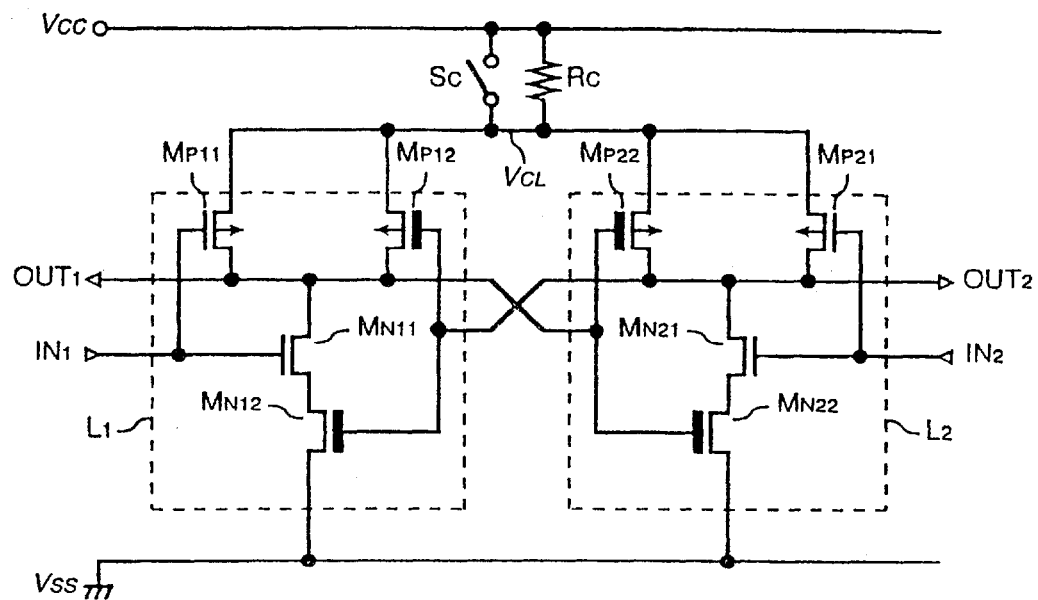
FIG. 17 is a circuit diagram showing a latch in an embodiment 11 of the present invention.

FIG. 17 shows an example in which the threshold voltage $V_T$ of four MOS transistors $M_{P12}$, $M_{P22}$, $M_{N12}$ and $M_{N22}$ used for latching information is made higher (more enhanced) than the threshold voltage of other MOS transistors $M_{P11}$, $M_{P21}$, $M_{N11}$ and $M_{N21}$ in order to further reduce the subthreshold current. Since the threshold voltage $V_T$ of other MOS transistors $M_{P11}$, $M_{P21}$, $M_{N11}$ and $M_{N21}$ to which the input signal is applied is left as it is (low), high-speed operation is possible. In this case, switches and resistances on the $V_{SS}$ side are not required because it is possible to cut off the current by means of transistors $M_{N12}$ and $M_{N22}$ on the $V_{SS}$ side having high threshold voltages.

Embodiments 12, 13

In the embodiments shown up to this point, it has been possible to reduce the subthreshold current whether the input signal is at a low level or at a high level. In a practical LSI, however, the level of a specific signal in the period where the subthreshold current reduction is required, e.g., in a standby state is often known in advance. In such cases, it is possible to reduce the subthreshold current by a simpler circuit.

Figure 18:
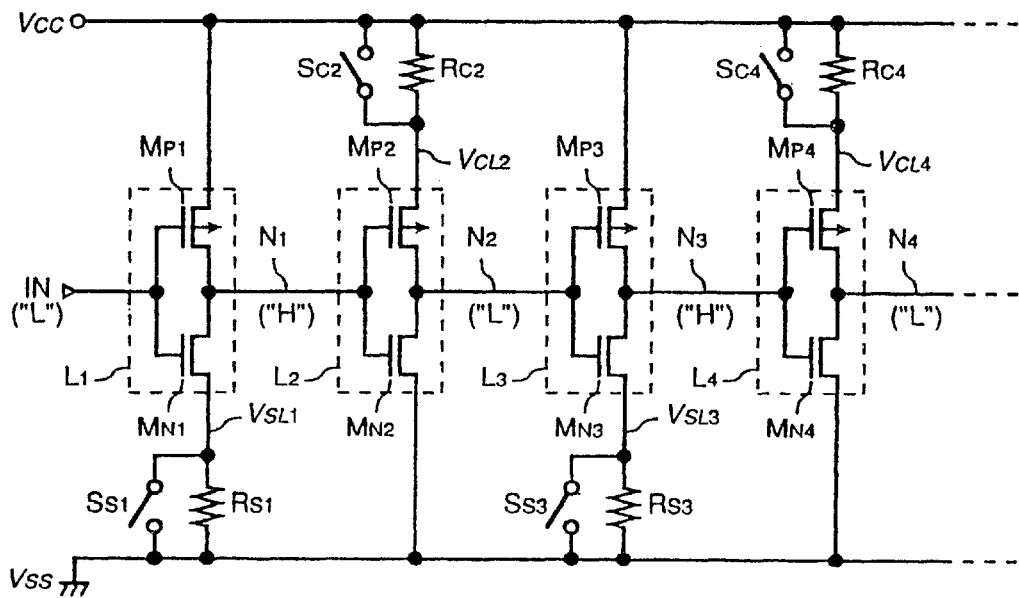
FIG. 18 is a circuit diagram of an inverter chain in an embodiment 12 of the present invention.

FIG. 18 shows a circuit example of an inverter chain in which it is found that the input signal IN in a standby state is at a low level "L". Since IN is at a low level, nodes $N_1$, $N_3$, $N_5$, ... show a high level, and nodes $N_2$, $N_4$, $N_6$, ... show a low level. Thus, $M_{P2}$, $M_{P4}$, ... among P-channel MOS transistors are in an off state, and $M_{N1}$, $M_{N3}$, ... among N-channel MOS transistors are in an off state. It is sufficient to insert switches and resistances in the sources of these transistors in an off state because the subthreshold current flows in the transistor in the off state.

Figure 19:
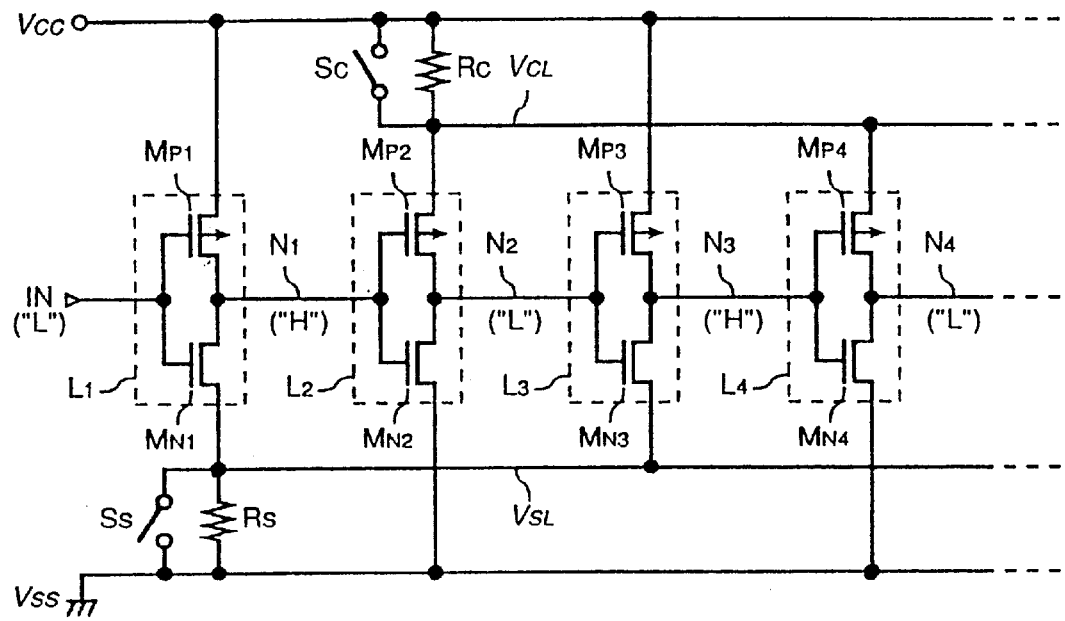
FIG. 19 is a circuit diagram of an inverter chain in an embodiment 13 of the present invention.

Further, there is no problem if the switch and the resistance are held in common by means of a plurality of inverters as shown in FIG. 19.

Although these embodiments are restricted by the fact that the level of the input signal has to be known, there is such an advantage that the subthreshold current can be reduced by a simple circuit. As it becomes apparent when FIGS. 18 and 19 are compared with FIG. 11A, the number of switches and resistances is reduced and the level conversion circuit becomes unnecessary.

Embodiments 14, 15

In not only an inverter, but also in a logic gate such as a NAND gate and a NOR gate, it is possible to reduce the subthreshold current by a simpler circuit when the level of the input signal in a standby state has been known.

Figure 20:
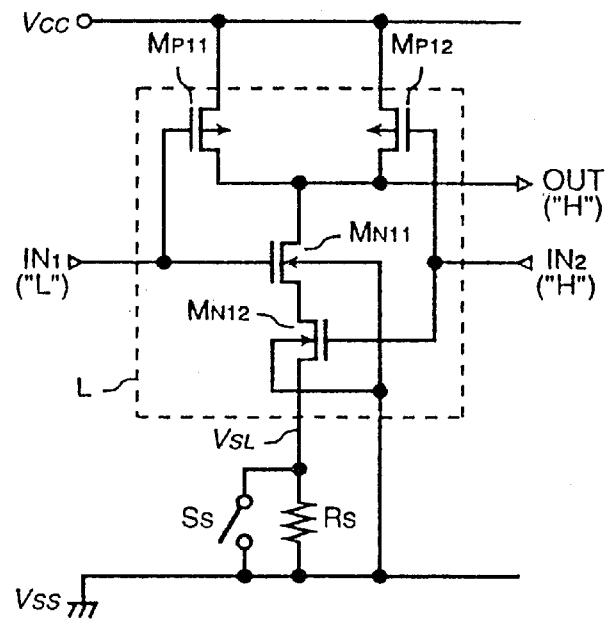
FIG. 20 is a circuit diagram of a NAND gate in an embodiment 14 of the present invention.
Figure 21:
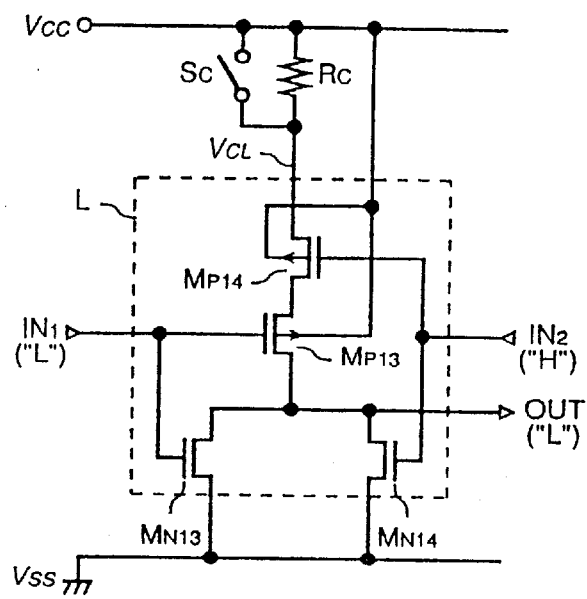
FIG. 21 is a circuit diagram of a NOR gate in an embodiment 15 of the present invention.

FIG. 20 shows an example of a two-input NAND gate, and FIG. 21 shows an example of a two-input NOR gate. In the case when both input signals $IN_1$ and $IN_2$ are at a low level or when both are at a high level, these gates are substantially equivalent to the inverter. Consequently, the method described with reference to FIG. 18 and FIG. 19 is applicable. The problem exists in a case that one input is at a low level "L" and the other input is at a high level "H" as shown in the figures.

In the case of the NAND gate shown in FIG. 20, a P-channel MOS transistor $M_{P12}$ and an N-channel MOS transistor $M_{N11}$ are in an off state. Since the output OUT is at a high level, however, it is $M_{N11}$ that the subthreshold current flows in. Thus, it is sufficient to insert a switch and a resistance on the $V_{SS}$ side. Conversely, in the case of a NOR gate shown in FIG. 21, it is a P-channel MOS transistor $M_{P14}$ that the subthreshold current flows in. Thus, it is sufficient to insert a switch and a resistance on the $V_{CC}$ side.

FIG. 20 and FIG. 21 show examples in which the present invention is applied to two-input logic gates, but the present invention is also applicable in a similar manner to a logic gate having three inputs or more. Further, it is a matter of course that the switch and the resistance may be held in common with other logic gates.

Embodiment 16

Figure 22:
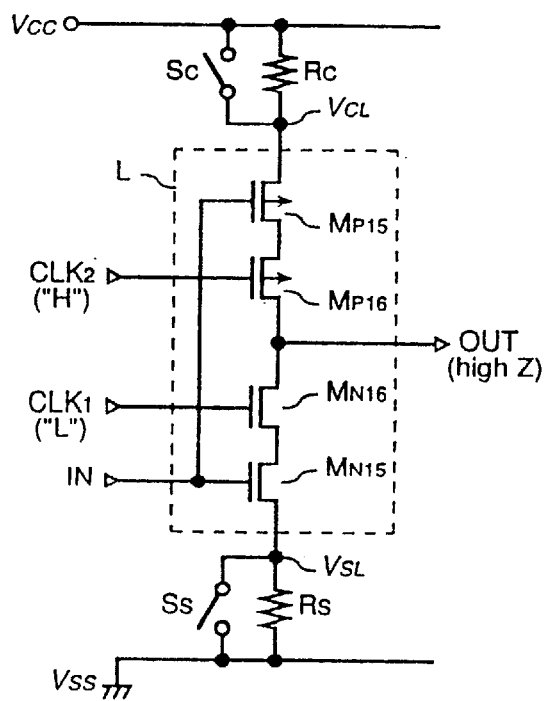
FIG. 22 is a circuit diagram of a clocked inverter in an embodiment 16 of the present invention.

FIG. 22 shows a circuit example in case it is comprehended that a clock $CLK_1$ is at a low level and a clock $CLK_2$ is at a high level in a standby state in a clocked inverter. Since both MOS transistors $M_{P16}$ and $M_{N16}$ are in an off state in this case, the output OUT shows a high impedance, and the voltage level thereof is determined by another circuit (not illustrated) connected to OUT. Since it is determined by the voltage level in which of the transistors $M_{P16}$ or $M_{N16}$ the subthreshold current flows, it is sufficient to insert switches and resistances on both of the $V_{CC}$ side and the $V_{SS}$ side in this case.

Embodiment 17

In the case of a general combinational logic circuit, it is possible to reduce the subthreshold current by a simpler circuit when the level of the input signal has been comprehended in advance. Description will be made by taking the combinational logic circuit shown in FIG. 23 as an example.

Figure 23:
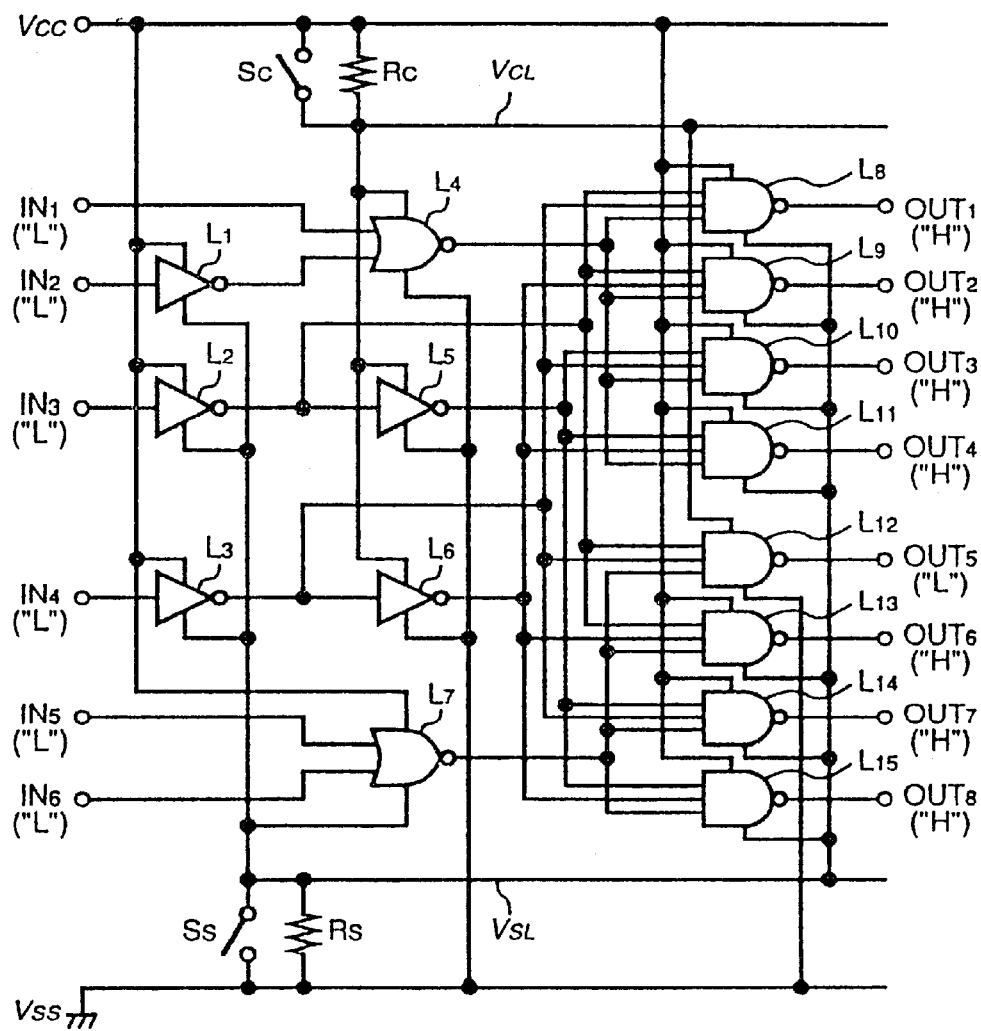
FIG. 23 is a circuit diagram of a combinational logic circuit in an embodiment 17 of the present invention.

FIG. 23 shows a circuit structure example for the case where all of inputs $IN_1$ to $IN_6$ of this circuit are at a low level. As to inverters $L_1$ to $L_3$, $L_5$ and $L_6$, switches and resistances are inserted on the $V_{SS}$ side of $L_1$ to $L_3$ and the $V_{CC}$ side of $L_5$ and $L_6$ similarly to FIG. 18 and FIG. 19. Since the input signals are all at a low level, a NOR gate $L_7$ is substantially equivalent to an inverter. Consequently, it is sufficient to insert a switch and a resistance on the $V_{SS}$ side. Since one of input signals is at a low level and the other is at a high level with respect to a NOR gate $L_4$, a switch and a resistance are inserted on the $V_{CC}$ side similarly to FIG. 21. Since all of three input signals are at a low level only for $L_{12}$ among eight NAND gates and $L_{12}$ is equivalent to an inverter, a switch and a resistance are inserted on the $V_{CC}$ side. Since input signals at a low level and at a high level are included for other NAND gates, it is sufficient to insert a switch and a resistance on the $V_{SS}$ side similarly to FIG. 20.

As is apparent from the above description, it is sufficient to insert a switch and a resistance on the $V_{SS}$ side for a logic gate having an output at a high level and on the $V_{CC}$ side for a logic gate having an output at a low level. The layout area can be saved by holding these switches and resistances in common by a plurality of logic gates.

Embodiment 18

Figure 24:
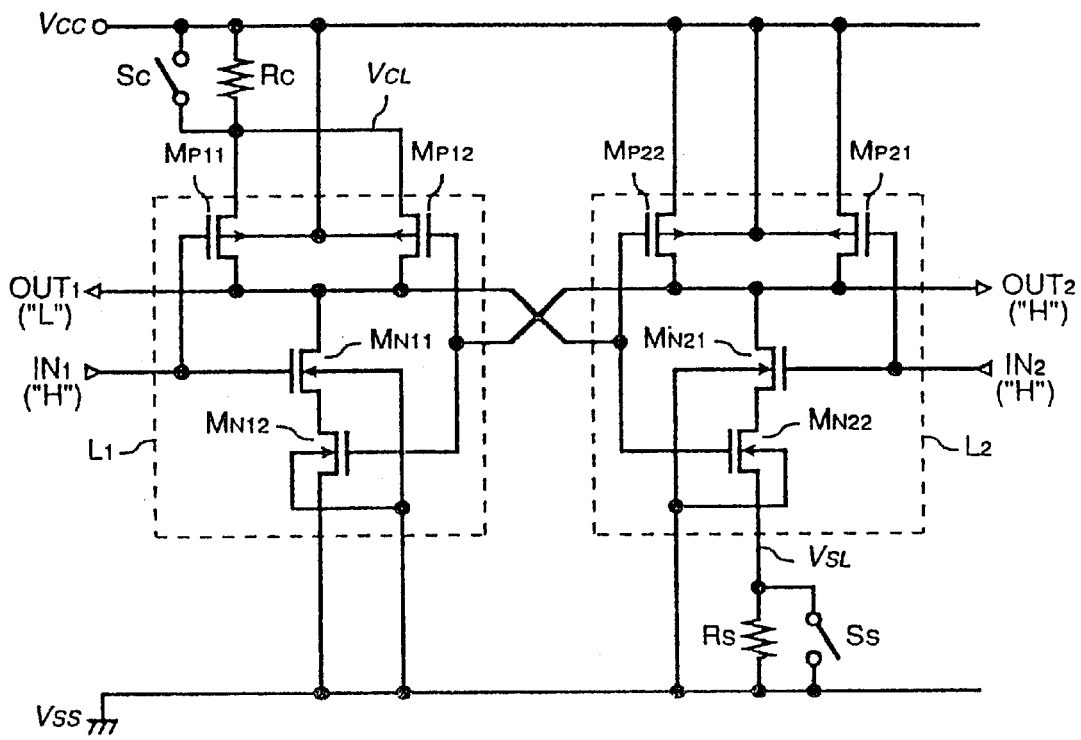
FIG. 24 is a circuit diagram of a latch in an embodiment 18 of the present invention.

It is also possible to reduce the subthreshold current by a simpler circuit as for a circuit with feedback in case the level of a signal is known in advance. FIG. 24 shows an example in which the present invention is applied to a latch circuit shown in FIG. 16A.

In a latch circuit of this sort, both input signals $IN_1$ and $IN_2$ are normally at a low level in a standby state, and one of output signals $OUT_1$ and $OUT_2$ is brought to a high level and the other is brought to a high level, thus holding information in one bit. FIG. 24 shows a circuit structure example in case it is comprehended that $OUT_1$ is at a low level and $OUT_2$ is at a high level. A NAND gate $L_1$ is equivalent to an inverter since two input signals thereof are both at a high level, and a switch and a resistance are inserted on the $V_{CC}$ side similarly to FIG. 18 and FIG. 19. It is sufficient to insert a switch and a resistance on the $V_{SS}$ side similarly to FIG. 20 for a NAND gate $L_2$ since one of input signals thereof is at a low level and the other is at a high level. It is a matter of course that these switches and resistances may be held in common with other logic gates.

Embodiment 19

Figure 25:
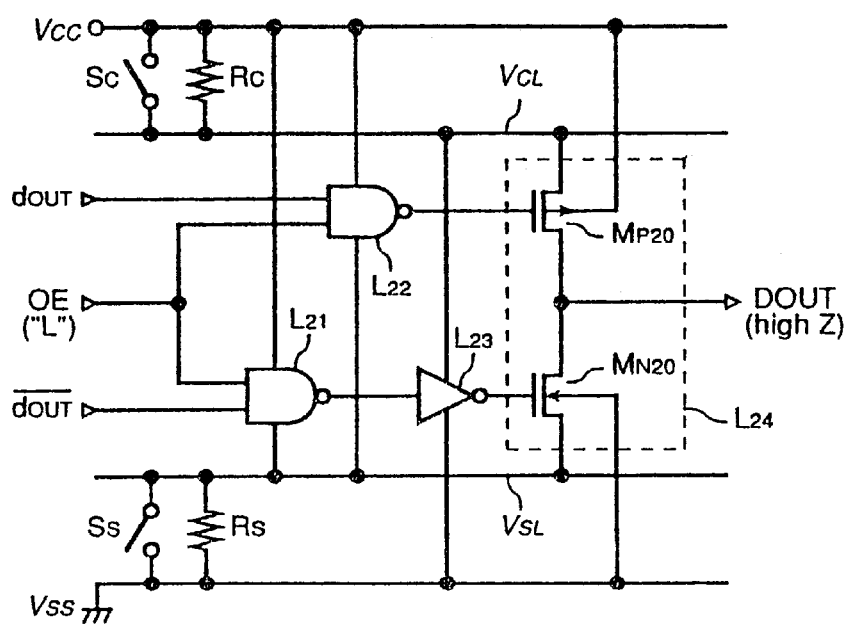
FIG. 25 is a circuit diagram of an output buffer in an embodiment 19 of the present invention.

FIG. 25 shows an example in which the present invention is applied to a well known data output buffer in a memory LSI or the like. In a standby state, an output enable signal OE is at a low level, outputs of NAND gates $L_{21}$ and $L_{22}$ are at a high level and an output of an inverter $L_{23}$ is at a low level. Accordingly, two MOS transistors $M_{P20}$ and $M_{N20}$ constituting an output stage $L_{24}$ are both in an off state, and an output DOUT has a high impedance.

As to logic gates $L_{21}$ to $L_{23}$, it is sufficient to insert a switch and a resistance on the $V_{SS}$ side or the $V_{CC}$ side in accordance with the policy stated in the description with reference to FIG. 23. As to an output stage $L_{24}$, it is sufficient to insert switches and resistances on both the $V_{CC}$ side and the $V_{SS}$ side in a similar manner to the case of the clocked inverter shown in FIG. 22.

Embodiment 20

Figure 26:
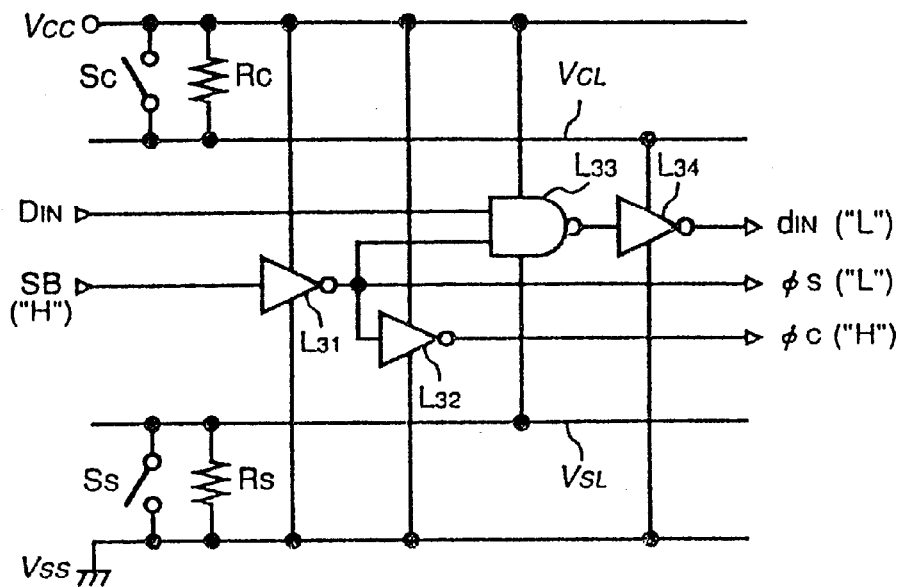
FIG. 26 is a circuit diagram of an input buffer in an embodiment 20 of the present invention.

FIG. 26 shows an example in which the present invention is applied to a well known data input buffer in a memory LSI or the like. In FIG. 26, SB represents a signal which shows a high level in a standby state. Outputs of inverters $L_{31}$ and $L_{32}$ can be used as $\phi_S$ and $\phi_C$ for controlling switches respectively as shown in FIG. 4 and FIG. 7. $L_{33}$ represents a NAND gate and receives $\phi_S$ and a data input signal $D_{IN}$. Since $\phi_S$ is at a low level in a standby state, the output of $L_{33}$ shows a high level irrespective of $D_{IN}$. Thus, an output $d_{IN}$ of an inverter $L_{34}$ shows a low level. On the other hand, since SB is at a low level in an operating state, $d_{IN}$ follows in the wake of $D_{IN}$.

Concerning the NAND gates $L_{33}$ and the inverter $L_{34}$, the subthreshold current can be reduced by inserting switches and resistances on the $V_{SS}$ side and the $V_{CC}$ side, respectively. Although such techniques cannot be applied to the inverters $L_{31}$ and $L_{32}$, the subthreshold current can be reduced by enhancing the threshold voltages of the MOS transistors. Since high-speed performance is not required in many cases for changing over the standby state to and from the operating state, there is no problem in using MOS transistors having enhanced threshold voltages.

A data input buffer has been described above, but the same is applied to an input buffer for an address signal and other signals.

The embodiments illustrated in FIGS. 18 to 25 have a merit that the subthreshold current can be reduced by a simple circuit, but on the other hand, these embodiments are restricted by that they are unapplicable unless the signal level in a period where subthreshold current reduction is required, e.g., in a standby state, is known. Accordingly, it is desirable at this time to settle the levels of as many nodes as possible in the LSI. It is possible to have the level of the signal $d_{IN}$ at this time settled to a low level by using a circuit such as the input buffer shown in FIG. 26 as means for the above. As another method for deciding upon the level, there is also a method wherein the data input terminal $D_{IN}$ is specified to be a low level (or a high level) in case of a standby state.

The embodiments illustrated in FIG. 18 to FIG. 26 are suitable for application to a memory LSI. Because, in the memory LSI, there are comparatively many nodes in which either a high level or a low level is known at time of standby state, and the levels of most nodes can be settled by using the input buffer shown in FIG. 26.

Figure 35:
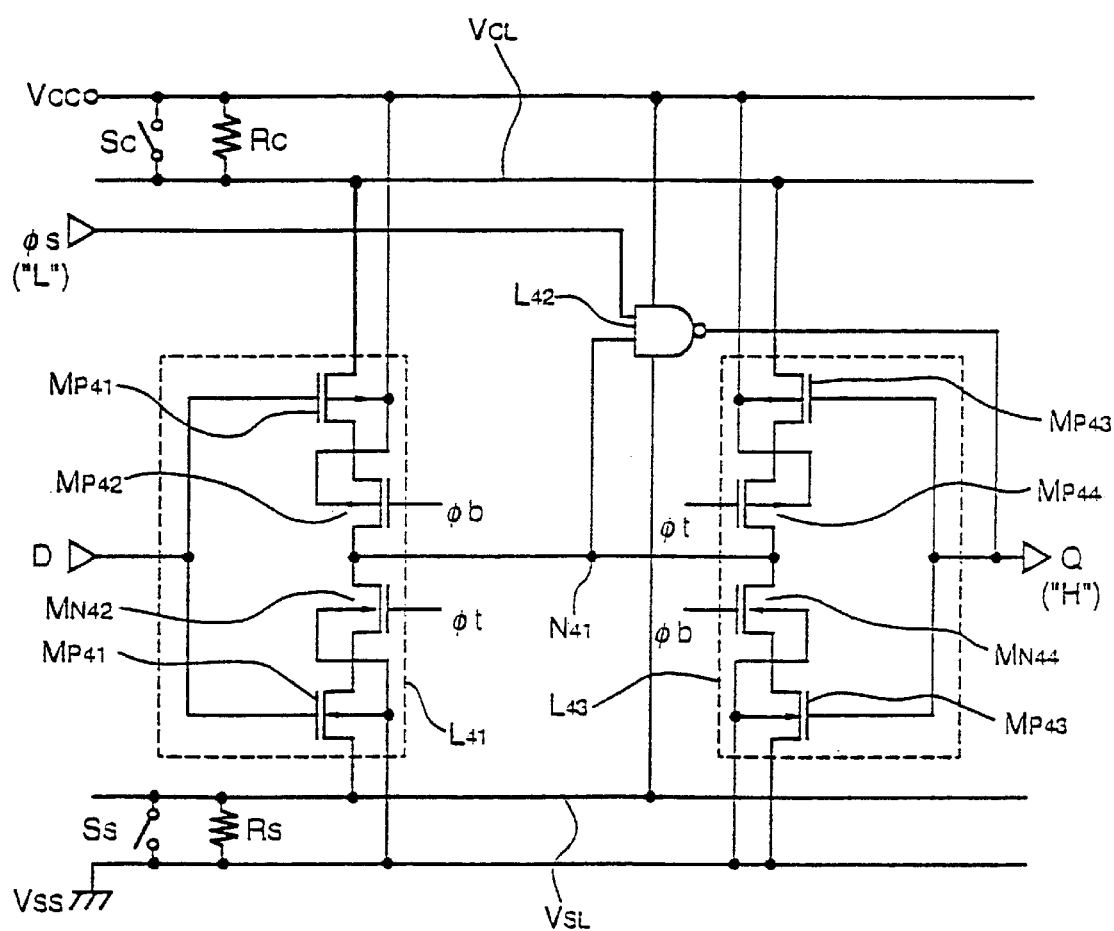
FIG. 35 is a circuit diagram showing a latch capable of providing a fixed output.
Figure 36:
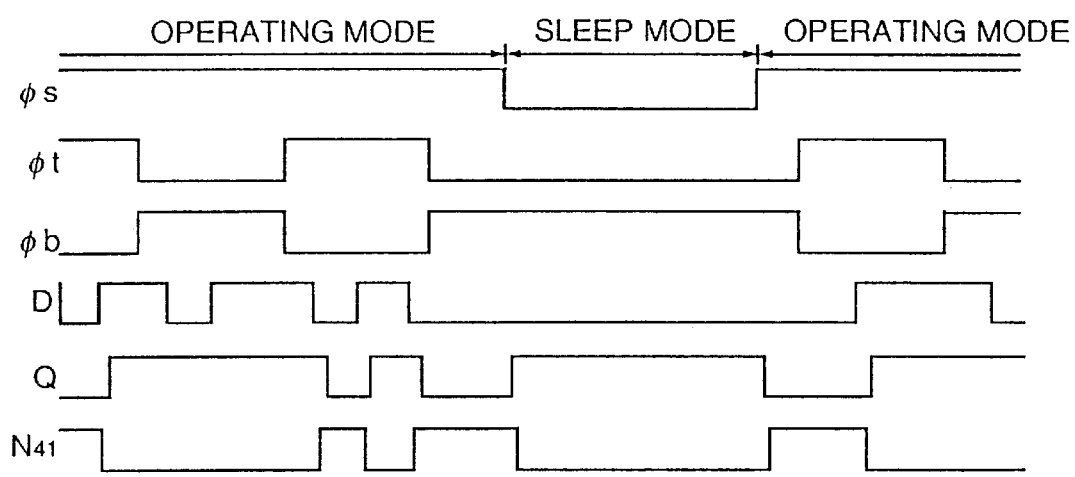
FIG. 36 is a timing chart for explaining the timing of the operation of the circuit of FIG. 35.
Figure 37:
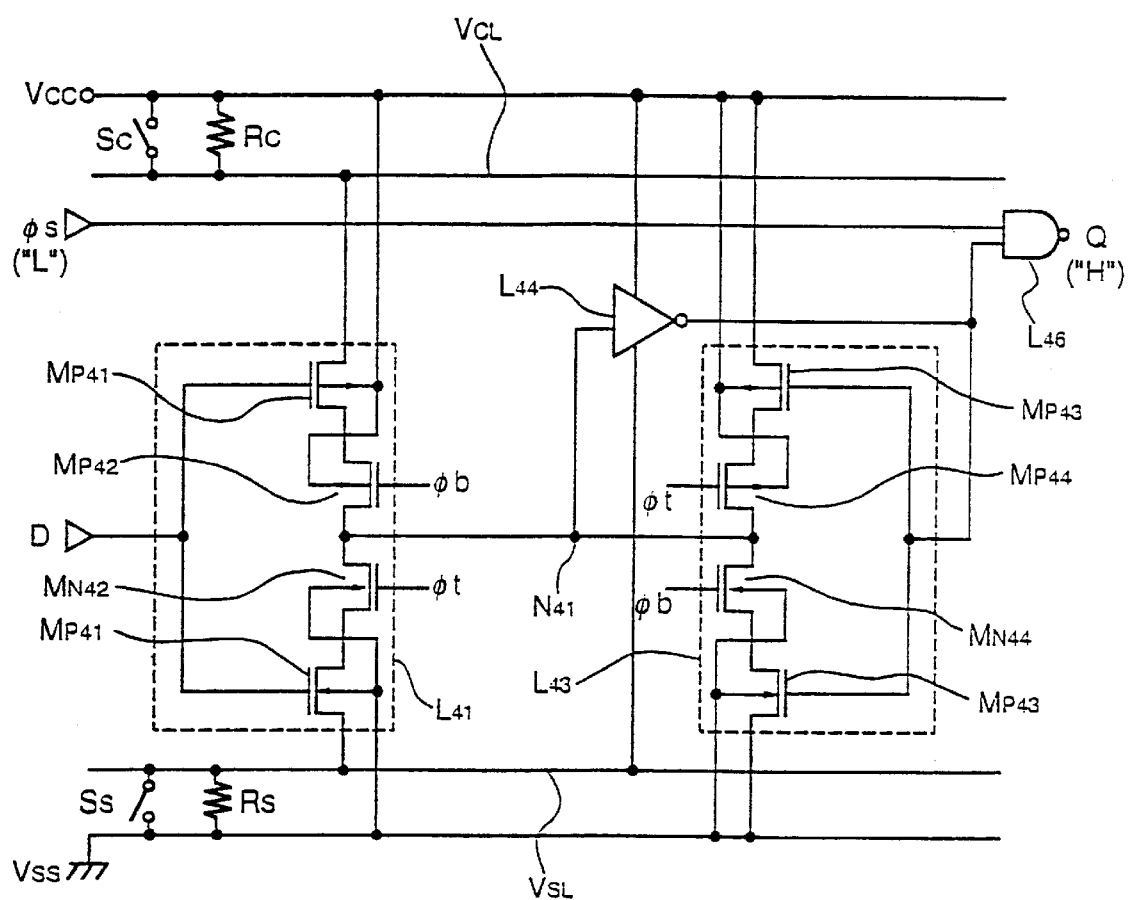
FIG. 37 is a circuit diagram of a latch capable of providing a fixed output.
Figure 38:
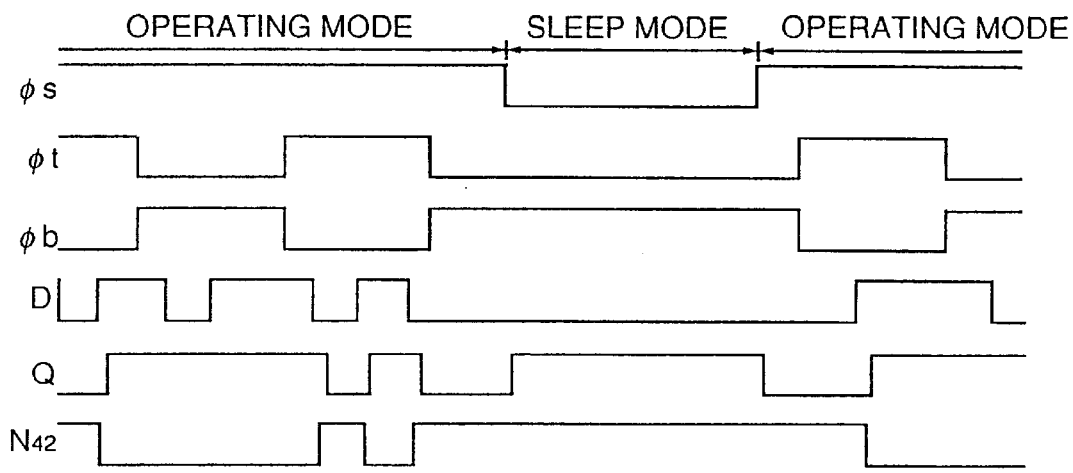
FIG. 38 is a timing chart for explaining the timing of the operation of the circuit of FIG. 37.

In the random logic LSI such as a microprocessor, it is effective to fix the voltage of a troublesome node forcibly by fixing the output of an internal register or by adding a logic such as a flip-flop having a resetting function. FIG. 35 shows an embodiment of the structure of the latch capable of fixing an output. This circuit is simplified by replacing the inverter in the ordinary latch by a NAND circuit. As illustrated in FIG. 36, the latch operates as an ordinary one while the signal $\phi_S$ is at the high level, and the level of the output signal Q is fixed to the high level while the signal $\phi_S$ is at the low level (or in a sleep mode). Here, the sleep mode is one for interrupting the operation of the entire LSI or the circuit block unit so as to reduce the current dissipation. Incidentally, the subthreshold current of the latch itself can be reduced in the sleep mode if the signal $\phi t$ is at the low level whereas the signal $\phi b$ is at the high level. If this latch is used, the node $N_{41}$ is forcibly set to the high level because the signal $\phi_S$ takes the low level, so that the data are erased from the register in the sleep mode. However, this erasure raises no problem even in the use, in which the necessary data in the CPU are saved to the main memory to open the reset state again after the sleep mode, that is, for the resume function in which a notebook personal computer is held in the standby state if it receives no input for a predetermined period. FIG. 37 shows another embodiment of the latch capable of fixing the output forcibly. As shown in FIG. 38, this circuit also acts as an ordinary latch while the signal $\phi_S$ is at the high level and fixes the level of the output signal Q to the high level while the signal $\phi_S$ is at the low level. This latch can retain the data even in the sleep mode because the node $N_{41}$ is not influenced even if the signal $\phi_S$ takes the low level. The operation can be reopened from the state before the sleep mode after this sleep mode is released and can establish the sleep mode even while the CPU is executing its task. Thus, this embodiment is suitable for the case in which the operation is resumed after a relatively short time from the sleep mode.

The embodiments illustrated in FIGS. 25 and 26 can be used not only as an input-output circuit for an external terminal of an LSI chip, but also as driver/receiver for an internal bus of a microprocessor for instance.

Embodiment 21

Figure 27:
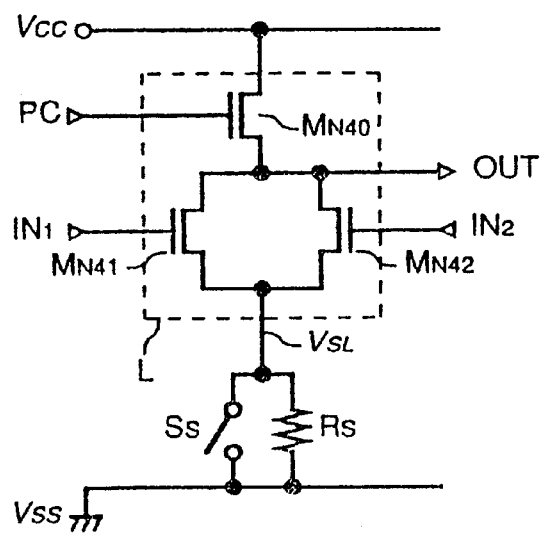
FIG. 27 is a circuit diagram of an NMOS dynamic circuit in an embodiment 21 of the present invention.

The embodiments in which the present invention is applied to a CMOS circuit have been described so far, but the present invention is also applicable to a circuit composed of MOS transistors having a single polarity. FIG. 27 shows an example of a circuit composed of N-channel MOS transistors only. In FIG. 27, PC represents a precharge signal, and $IN_1$ and $IN_2$ represent input signals.

At the time of standby, i.e., in a precharge state, PC is at a high level and $IN_1$ and $IN_2$ are at a low level, and the output OUT is precharged to a high level ($=V_{CC}-V_T$). At the time of operation, $IN_1$ and $IN_2$ are brought to a high level or remain at a low level after PC is brought to a low level. When at least one of $IN_1$ and $IN_2$ is brought to a high level, OUT is brought to a low level. When both of $IN_1$ and $IN_2$ remain at a low level, OUT is left (as is) at a high level. Namely, this circuit outputs the NOR of $IN_1$ and $IN_2$.

In this circuit, $M_{N41}$ and $M_{N42}$ on the $V_{SS}$ side are those transistors that are in an off state at time of standby, and the subthreshold current flows in these transistors. Accordingly, in order to apply the present invention to this circuit, it is sufficient to insert a switch and a resistance on the $V_{SS}$ side as shown in the figure. They are not required on the $V_{CC}$ side.

Incidentally, in the LSI for complicated operations such as a random logic LSI, the logic (or voltage) state of each node in the chip in the standby state, for example, is determined by the design automation (DA) method so that the position to insert the aforementioned switch and resistor can be automatically determined by the DA.

As described above, the present invention is very effective for achieving low power consumption of MOS transistor circuits and a semiconductor integrated circuit composed of the same. The demand for low power consumption of a semiconductor integrated circuit is great, and recently a microprocessor system having a low power backup mode was described in the Sep. 2, 1991, issue of Nikkei Electronics, pp. 106–111, for instance. In the backup mode, the clock is stopped and the supply of power to unnecessary parts thereof is suspended, thereby reducing power consumption. However, no consideration is given to the extent of reduction of the subthreshold current. These processor systems operate at 3.3 to 5 V and can use transistors having a sufficiently high threshold voltage so that the subthreshold current is too low to raise any problem. However, if the operating voltage becomes as low as 2 or 1.5 V so that the threshold voltage has to be dropped, the excessive subthreshold current cannot be reduced any more by the method of the prior art using the CMOS circuit. When the present invention is applied to, for example, a resuming circuit to which the power is supplied even in the backup mode, lower power consumption can be realized.

Embodiment 22

Figure 28:
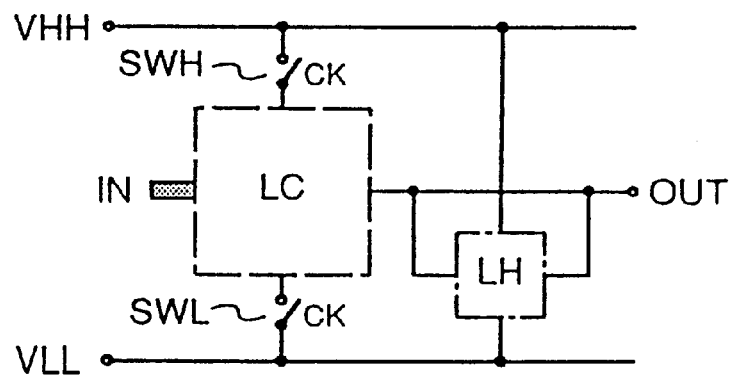
FIG. 28 is a diagram showing an embodiment 22 of the present invention, conceptually.

In the examples described above, there are such problems that the logic voltage swing is reduced with the increase of the number of stages, and a more or less complicated design is required for the case where the voltage level of an input signal is unknown. FIG. 28 shows a circuit for solving these problems, in which the switches are switched on so as to perform normal high-speed operation in a period required until the logic output is settled as described so far. In other periods than the above, a subthreshold current passage of a logic circuit is cut off by switching off the switches. However, since a supply passage of the power supply voltage is interrupted when the switches are switched off, the output of the logic circuit becomes floating, and the logic output is no longer settled. Thus, it is a feature that a sort of latch circuit (a level-hold circuit) for holding a voltage level is provided at the output thereof. If a transistor having a high threshold voltage or the like is used for the level-hold circuit, the subthreshold current of the level-hold circuit becomes negligibly small, thus making it possible to make the subthreshold current small on the whole. The delay time is affected little by the level-hold circuit, and is determined by the logic circuit. Even if a high-speed circuit having large driving capability is used in the logic circuit, the consuming current is only the current flowing through the level-hold circuit since no current flows through the logic circuit in a standby state. The level-hold circuit may have a small driving capability since it only holds the output, thus making it possible to reduce the current consumption. Since the output of the logic circuit is held by the level-hold circuit even if the switches are switched off, there is no possibility of inversion of the output and the operation is stabilized. Thus, a semiconductor device operating stably with low power consumption and at a high speed can be realized. According to the present embodiment, since the voltage level is always guaranteed at a constant value by means of the level-hold circuit, the logic voltage swing will never be decreased with the increase of the number of the logic stages. Further, the present embodiment is effective independent of the logic input.

The present embodiment will be described further with reference to FIG. 28. A logic circuit LC is connected to a power supply line VHH at a high potential and a power supply line VLL at a low potential through switches SWH and SWL. Here, it is also possible to have VHH and VLL correspond to $V_{CC}$ and $V_{SS}$ which have been heretofore described, respectively. A level-hold circuit LH is connected to an output terminal OUT of the logic circuit LC. Switches SWH and SWL are controlled by a control pulse CK so as to be switched on and off at the same time. The logic circuit LC is composed of a logic gate such as an inverter, a NAND circuit, a NOR circuit, a flip-flop circuit, or a plurality of combinations thereof. The level-hold circuit LH can be composed of a positive feedback circuit.

The operation of the logic circuit LC is performed with the switches SWH and SWL on. After an output OUT in accordance with an input IN of the logic circuit LC is settled or determined, the switches SWH and SWL are switched off, a current passage from VHH to $V_{SS}$ through the logic circuit LC is cut off, and the output of the logic circuit LC is held by the level-hold circuit LH.

The delay time of a circuit is affected little by the level-hold circuit LH, and is determined by the logic circuit LC. It is possible to perform a high-speed operation having a short delay time by using a circuit having large driving capability for the logic circuit LC. For example, in a standby state, since no current flows through the logic circuit LC, the consuming current is the only one that flows through the level-hold circuit LH. Since a level-hold circuit LH having small driving capability will suffice, the consuming current can be made small. Moreover, since the output OUT of the logic circuit LC is maintained by means of the level-hold circuit LH, there is no possibility of malfunction. Hence, a circuit which performs stabilized operation with low power consumption and at a high speed can be realized.

Embodiment 23

Figure 29:
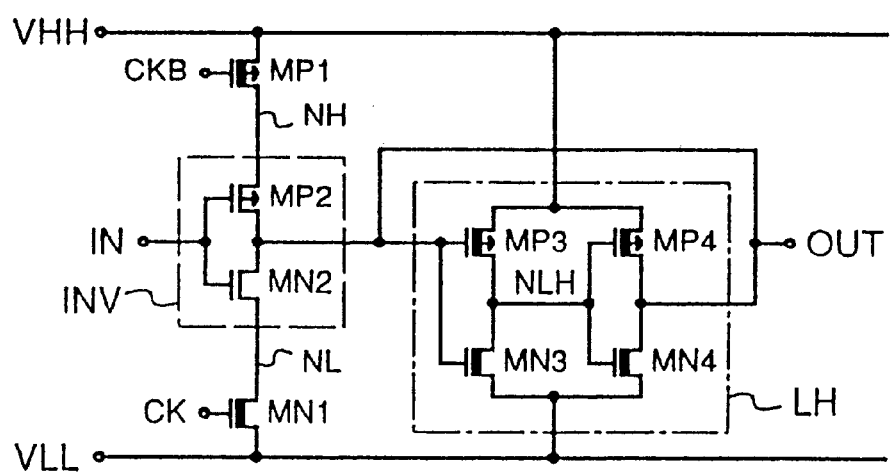
FIG. 29 is a circuit diagram of a CMOS inverter in an embodiment 23.

An embodiment in which the present invention is applied to a CMOS inverter is shown in FIG. 29. An NMOS transistor MN1 and a PMOS transistor MP1 operate as the switches SWL and SWH shown in FIG. 28, respectively. In order to reduce a leakage current when the switches are switched off, the threshold voltages of the transistors MN1 and MP1 are made sufficiently high. Their channel width/length ratios are determined so that on state resistances do not become large. A control pulse CK is inputted to the gate of the NMOS transistor MN1 and a control pulse CKB is inputted to the date of the PMOS transistor MP1. CKB represents a complementary signal of CK. A CMOS inverter INV composed of an NMOS transistor MN2 and a PMOS transistor MP2 is connected to MN1 and MP1. In order to increase the driving capability in low voltage operation, the threshold voltages of the transistors MN2 and MP2 are made low. The level-hold circuit LH composed of NMOS transistors MN3 and MN4 and PMOS transistors MP3 and MP4 is connected to an output terminal OUT of the inverter INV. In order to reduce a penetrating current while holding the output, the threshold voltages of the transistors MN3, MN4, MP3 and MP4 are made sufficiently high, and the channel width/length ratios thereof are made sufficiently small. An example of numeric values of the power supply voltage and the threshold voltages will be shown. VLL is set to the ground potential at 0 V, and VHH is set to the external power supply voltage at 1 V. The threshold voltages of the NMOS transistors are set to 0.2 V for MN2 and to 0.4 V for MN1, MN3 and MN4. The threshold voltages of the PMOS transistors are set to −0.2 V for MP2 and to −0.4 V for MP1, MP3 and MP4.

Figure 30:
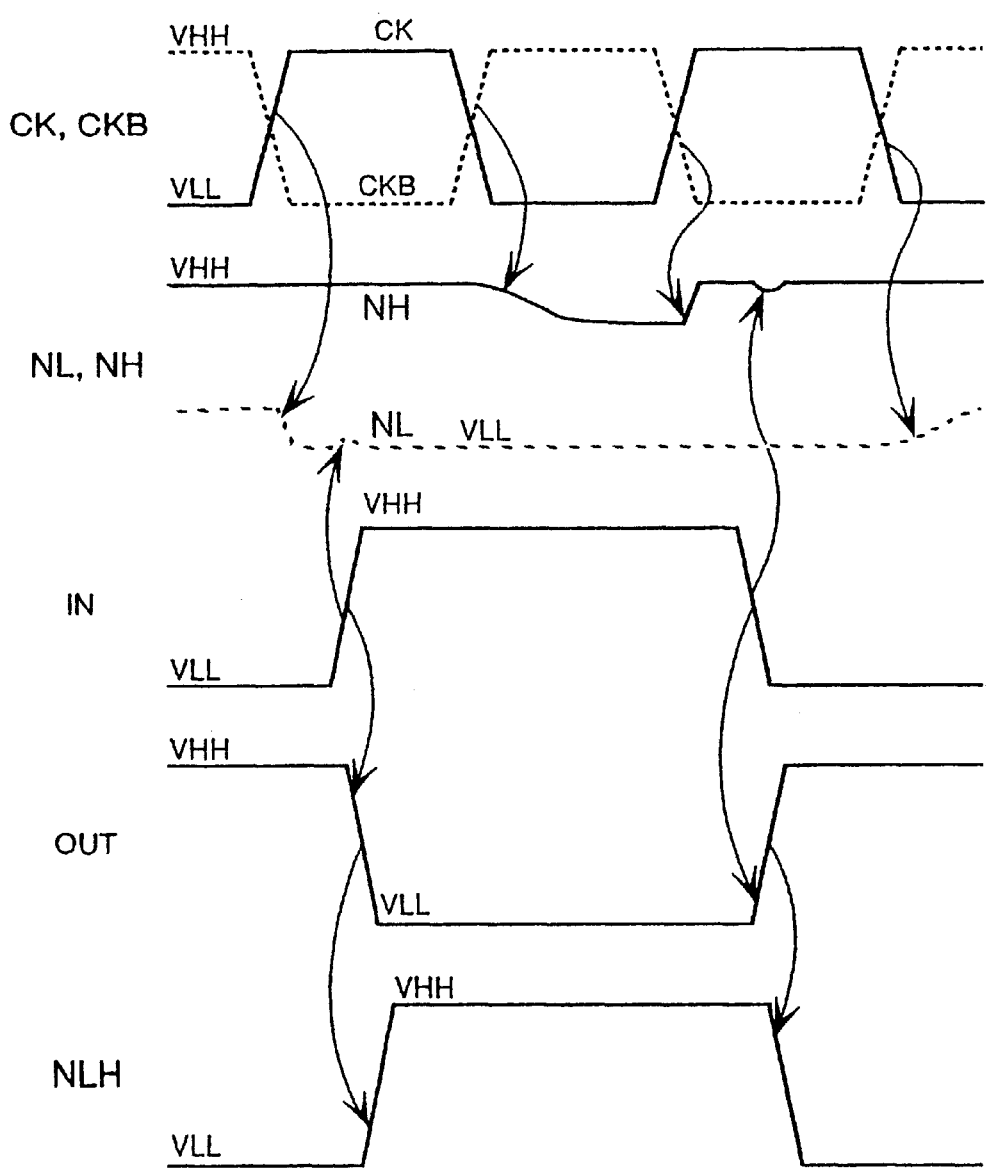
FIG. 30 is an operation timing diagram of a CMOS inverter in an embodiment 23.

The operation will be described with reference to a timing chart shown in FIG. 30. First, the control pulse CK is raised to VHH, CKB is lowered to VLL, transistors MN1 and MP1 are turned on, and the inverter INV is connected to VHH and VLL. When the input signal IN is raised to VHH from VLL, MP2 is turned off and MN2 is turned on, and the output OUT is discharged from VHH to VLL. The transistor MN2 starts conduction in a saturated region, and the value of the current flowing in MN2 is determined by the voltage between the gate (input terminal IN) and the source (node NL). Since the transistor MN1 is provided between the node NL and VLL, the potential of the node NL rises temporarily by the on-state resistance of MN1 and the current flowing from MN2. Since the gate of MN1 is at VHH, however, a design is possible so that the on-state resistance becomes sufficiently small even if the threshold voltage is high, thus reducing the influence upon the delay time. Further, MN4 is in an off state and MP4 is in an on state so that the level-hold circuit LH holds the output OUT at VHH when the output OUT is inverted to VLL. As a result, a current flows from VHH to VLL through MP4 and MN2 since MN2 is turned on, but the influence exerted on the delay time and the current consumption is small by designing the driving capability of MP4 small as compared with that of MN2. When the output OUT lowers, MN3 is turned off and MP3 is turned on, a node NLH in the level-hold circuit is inverted from VLL to VHH, MN4 is turned on and MP4 is turned off, and the level-hold circuit LH operates so as to hold the output OUT at VLL, thus preventing current from flowing. MP2 is in an off state since the gate and the source are both at VHH, but the leakage current is large and current flows through the inverter INV since the threshold voltage is low. Then, the control pulse CK is lowered to VLL, CKB is raised to VHH, and the transistors MN1 and MP1 are turned off, thus isolating the inverter INV from VHH and VLL. At this time, MN1 and MP1 are turned off completely because the gate and the source thereof are at equal potential and the threshold voltage is high. The output OUT is held at VHH by positive feedback of the level-hold circuit LH. Since the NMOS transistor MN2 is in an on state, the node NL is held at VLL. On the other hand, the voltage of a node NH starts to drop due to the leakage current of the PMOS transistor MP2 from the node NH to the output terminal OUT. Then, the source potential drops lower than the gate potential, and MP2 is turned off completely. As a result, the current of the inverter INV does not flow in a standby state. Further, before the input signal IN changes, the control pulse CK is raised to VHH, CKB is lowered to VLL, and the transistors MN1 and MP1 are turned on, thus bringing the node NH to VHH. Since the input IN is inverted from VHH to VLL, the output OUT is inverted from VLL to VHH.

It is desirable that the level-hold circuit LH follows the output OUT quickly so that the period of time when the current flows through the inverter INV and the level-hold circuit LH becomes shorter. Consequently, the inverter INV and the level-hold circuit LH are arranged close to each other so as to reduce the wiring delay.

As is apparent from the present embodiment, when the threshold voltage of the MOS transistor used as the switch is brought to approximately 0.4 V or higher which has been deemed to be required to reduce the subthreshold current, it is possible to lower the threshold voltage of the MOS transistor in the logic circuit without increasing the current flow in a standby state. Even if the operating voltage is lowered to 1 V or lower, it is possible to set the threshold voltage of the MOS transistor to 0.25 V or below, thereby to secure driving capability. Thus, low power consumption by lowering of voltage can be realized. Further, it is possible to realize performance improvement by the scaling down of elements based on a conventional scaling law. Moreover, since the structure is the same as a conventional CMOS logic circuit except that the switch and the level-hold circuit are loaded, the same design techniques as before can be used.

Embodiment 24

Figure 31:
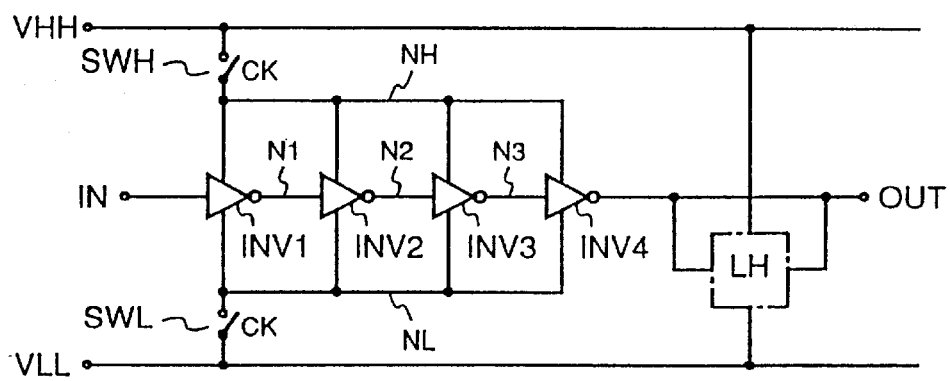
FIG. 31 is a diagram showing an inverter chain in an embodiment 24.

FIG. 31 shows an embodiment in which the present invention is applied to a CMOS inverter chain. An inverter chain can be realized by a multistage connection of two switches and also a level-hold circuit provided on the inverter at one stage as shown in FIG. 29. Also, by the present embodiment, the switches and level-hold circuit are held in common by a plurality of inverters so as to reduce the number of elements and the area. A case of an inverter chain with four stages is taken as an example here, but a case including a different number of stages is also structured in a similar manner. Four inverters INV1, INV2, INV3 and INV4 are cascaded. The level-hold circuit LH is connected to the output terminal OUT of the inverter INV4 at the last stage. Each inverter is composed of one PMOS transistor and NMOS transistor similarly to the INV shown in FIG. 29. The transistor size in respective inverters may either be the same as or different from each other. With a cascaded driver, it is also possible to increase the channel width in the order of INV1, INV2, INV3 and INV4 at a constant interstage ratio while keeping the channel length the same. The sources of the PMOS transistors of respective inverters are connected to the node NH, and the sources of the NMOS transistors thereof are connected to the node NL. A switch SWL is provided between the node NL and the power supply VLL on a low level, and a switch SWH is provided between the node NH and the power supply VHH on a high level. The switches SWL and SWH are controlled by a control pulse CK and switched on and off at the same time. As shown in FIG. 29, the switch SWL is realized by an NMOS transistor, and the switch SWH is realized by a PMOS transistor applied with a complementary signal of CK at the gate thereof.

The operation of the inverter chain is performed with the switches SWL and SWH on. For example, when the output IN is inverted from the low level VLL to the high level VHH, a node N1 is inverted from VHH to VLL by means of the inverter INV1, a node N2 is inverted from VLL to VHH by means of the inverter INV2, a node N3 is inverted from VHH to VLL by means of INV3, and the output OUT is inverted from VLL to VHH by means of INV4. When OUT is at VHH, the level-hold circuit LH is operated so as to hold OUT at VHH. In a standby state, the current passage from VHH to VLL through the inverters is cut off by switching off the switches SWL and SWH.

It is sufficient to provide a level-hold circuit at the output terminal thereof only by handling the inverter chain collectively as one logic circuit as in the present embodiment. Further, the switches SWL and SWH can be held in common by a plurality of inverters. The sizes of the switches SWL and SWH are determined by the magnitude of the peak current applied. The peak of the current sum flowing in a plurality of inverters becomes smaller than the sum of peak currents in respective inverters. For example, when an inverter chain is formed assuming an interstage ratio at 3, the peak of the current sum becomes almost equal to the peak current at the last stage. Accordingly, a small area of the switch will suffice when the switch is held in common by a plurality of inverters as compared to a case where a switch is provided for every inverter.

Embodiment 25

Figure 32:
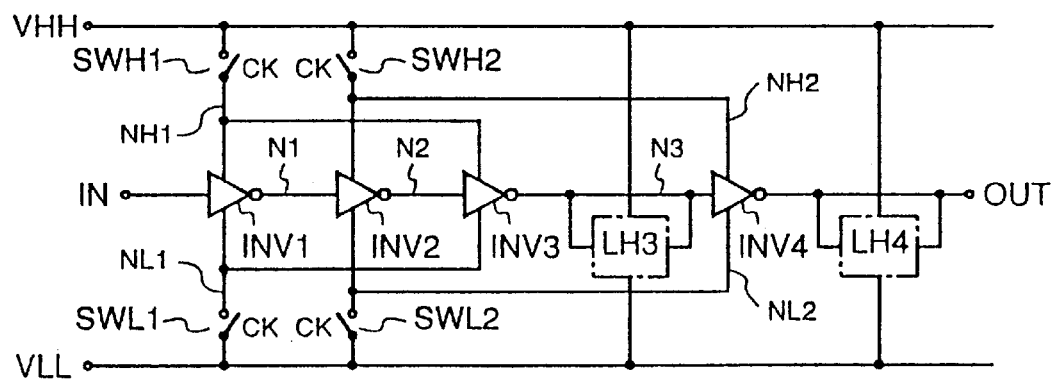
FIG. 32 is a diagram showing an inverter chain in an embodiment 25.

FIG. 32 shows another embodiment in which the present invention is applied to an inverter chain. A case of an inverter chain at four stages is taken as an example similarly to FIG. 31, but the inverter chain is structured similarly in the case of another number of stages, too. Inverters INV1, INV2, INV3 and INV4 are connected in series. Level-hold circuits LH3 and LH4 are connected to a node N3 which is an output terminal of the inverter INV3 and an input terminal of the inverter INV4 and to an output terminal OUT of INV4, respectively. Each inverter is composed of one each of a PMOS transistor and an NMOS transistor similarly to the INV shown in FIG. 29. Odd-numbered inverters INVL and INV3 are connected to nodes NL1 and NH1, and even-numbered inverters INV2 and INV4 are connected to nodes NL2 and NH2. Switches SWL1 and SWL2 are provided between the nodes NL1, NL2 and the power supply VLL on a low level side, respectively, and switches SWH1 and SWH2 are provided between the nodes NH1, NH2 and the power supply VHH on a high level side, respectively. The switches SWL1, SWL2 and SWH1, SWH2 are controlled by a control pulse CK, and switched on and off at the same time.

The operation of the inverters is performed with the switches SWL1, SWL2, SWH1 and SWH2 on. For example, when the input IN is inverted from the low level VLL to the high level VHH, a node N1 is inverted from VHH to VLL, a node N2 is inverted from VLL to VHH, a node N3 is inverted from VHH to VLL, and the output terminal OUT is inverted from VLL to VHH by means of INV4 in consecutive order. When N3 is at VLL, the level-hold circuit LH3 operates so as to hold N3 at VLL. Further, when OUT is at VHH, the level-hold circuit LH operates so as to hold OUT at VHH. For example, in a standby state, the current passages from VHH to VLL through the inverters are cut off by switching off the switches SWL1, SWL2, SWH1 and SWH2. At this time, since the node N3 is held at a low level VLL by the level-hold circuit LH3, the node NL1 is also held at VLL through the inverter INV3. Furthermore, the node N1 is held at VLL through the inverter INV1. Similarly, nodes NH2 and N2 are also held at VHH because the output terminal OUT is held at the high level VHH by means of the level-hold circuit LH4. Thus, the nodes connecting the inverters are held at either VHH or VLL.

As described above, the nodes N1, N2 and N3 among the inverters are all held at either a high level or a low level by providing two sets of switches, connecting odd-numbered inverters and even-numbered inverters to different switches and connecting the level-hold circuits to any output terminal of odd-numbered inverters and any output terminal of even-numbered inverters, respectively. Since the input to each inverter is not brought to an intermediate level even if the standby state continues for a long time, operation is stabilized, and neither data inversion nor DC current flow does not occur when the switches are turned on.

In the embodiments shown in FIGS. 29–32, the present invention is applied to a CMOS inverter and an inverter chain. However, the present invention is not limited to these embodiments described so far, but also includes other embodiments not departing from the gist that stabilized operation is performed with low power consumption and at a high speed by loading a logic circuit with a switch and a level-hold circuit.

Embodiment 26

Figure 33:
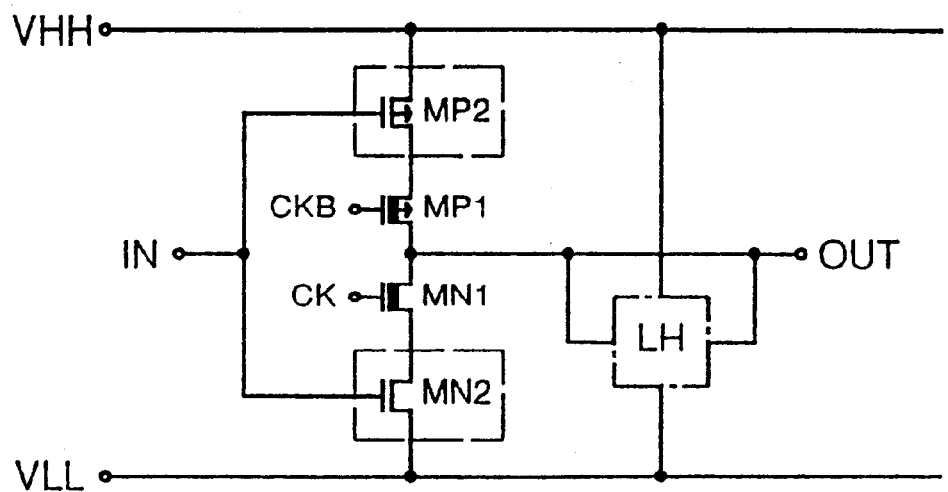
FIG. 33 is a diagram showing a CMOS inverter in an embodiment 26.

For example, another embodiment in which the present invention is applied to a CMOS inverter is shown in FIG. 33. In the embodiment shown in FIG. 29, transistors MN1 and MP1 operating as switches are provided between the CMOS inverter INV and power supplies VLL and VHH. In contrast to the above, these transistors are provided between an NMOS transistor and a PMOS transistor in the present embodiment.

Two NMOS transistors MN2 and MN1 and two PMOS transistors MP1 and MP2 are connected in series between the low level power-supply VLL and the high level power supply VHH. The NMOS transistor MN1 and the PMOS transistor MP1 operate as switches. In order to reduce the leak current when those transistors are turned off, the threshold voltages of the transistors MN1 and MP1 are made high. A control pulse CK is inputted to the gate of the NMOS transistor MN1 and a control pulse CKB of a complementary signal of CK is inputted to the gate of the PMOS transistor MP1. The NMOS transistor MN2 and the PMOS transistor MP2 are connected to the input terminal IN at the gates thereof, and operate as CMOS inverter. In order to increase the driving capability in low voltage operation, the threshold voltages of the transistors MN1 and MP1 are made low. A level-hold circuit LH structured similarly to FIG. 29 is connected to the output terminal OUT.

The operation is performed in a similar manner as the embodiment shown in FIG. 29. The transistors MN1 and MP1 are turned on by control pulses CK and CKB, thus having MN2 and MP2 operate as a CMOS inverter. For example, when the input IN is inverted from the low level VLL to the high level VHH, the transistor MN2 which has been in an off state starts to conduct and operates in a saturated region. At this time, the current value of MN2 is determined by the gate-source voltage. Since the transistor MN1 is provided between MN2 and the output terminal OUT, the on-state resistance of MN1 is connected to the drain of MN2. As a result, the influence of the on-state resistance of MN1 exerted upon the current value of MN2 is small. After the output OUT is determined, the transistors MN1 and MP1 are turned off, thereby to prevent further current flow and maintain the output OUT by means of the level-hold circuit LH.

When switches are inserted on the output terminal side of the logic circuit as in the present embodiment, it is impossible to hold the switches in common by means of a plurality of logic gates, but the influence of the on-state resistance of the switches is small. In case the transistors used as switches are the same, the delay time is reduced as compared with a case where the switches are provided on the power supply side of the logic circuit as in the embodiment shown in FIG. 29. Otherwise, if it is designed so that the delay time becomes equal, the channel width/length ratio of the transistor used as a switch may be reduced, thus enabling a reduction in area.

Embodiment 27

Figure 34:
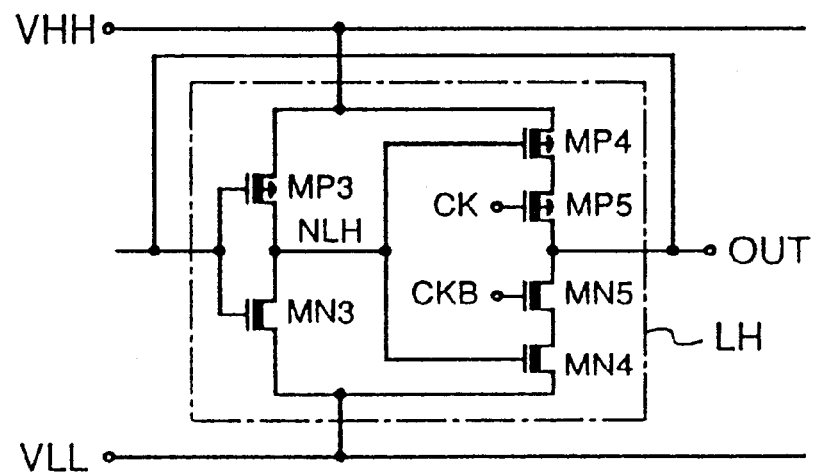
FIG. 34 is a circuit diagram of a level hold circuit in an embodiment 27.

FIG. 34 shows another structure example of the level-hold circuit. A case in which this level-hold circuit is replaced with a level-hold circuit composed of NMOS transistors MN3 and MN4 and PMOS transistors MP3 and MP4 in the embodiment shown in FIG. 29 will be described.

This level-hold circuit is composed of NMOS transistors MN3, MN4 and MN5 and PMOS transistors MP3, MP4 and MP5. In order to reduce the leakage current in a standby state, the threshold voltages of respective transistors are made high. For example, it is set to 0.4 V for the NMOS transistor and −0.4 V for the PMOS transistor. MN3 and MP3 form as inverter, and MN4, MN5, MP4 and MP5 form a clocked inverter. A control pulse CKB is inputted to the gate of MN5, and a control pulse CK is inputted to the gate of MP5. The operation timing is the same as the case when the level-hold circuit LH shown in FIG. 29 is used as shown in FIG. 30. The control pulse CK is raised to the high level VHH and CKB is lowered to the low level VLL so as to operate the inverter INV. At this time, the transistors MN5 and MP5 are turned off in the level-hold circuit. As a result, when the output OUT is inverted, current does not flow through the inverter INV and the level-hold circuit, and delay time and current consumption may be reduced. In a standby state, the control pulse CK is lowered to the low level VLL and CKB is raised to the high level VHH, and the inverter INV is isolated from power supplies VLL and VHH. At this time, the transistors MN5 and MP5 are turned on in the level-hold circuit, and the output OUT is held by positive feedback.

By forming the level-hold circuit by the combination of an inverter and a clocked inverter as described above, the number of transistors is increased by two, but the logic circuit and the level-hold circuit do no longer conflict with each other, and the delay time and the current consumption may be reduced. Further, the driving capability of the level-hold circuit may also be increased, and there is no possibility that the output fluctuates even when the leakage current through the output terminal is large, thus making stabilized operation possible.

Figure 39:
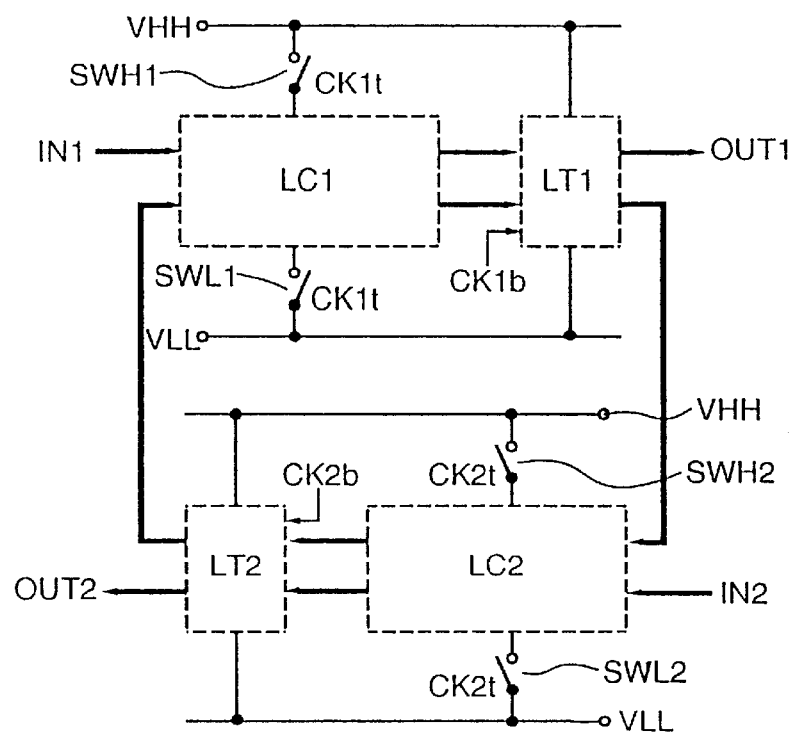
FIG. 39 is a diagram showing a dual-phase clock logic circuit.

FIG. 39 shows an embodiment in which this invention is applied to a logic circuit for logic operations with a dual-phase clock. In the LSI of an ordinary microprocessor, most of the logic operations in the chip are frequently synchronized with a dual-phase clock. The logic circuit is divided into the logic circuits LC1 and LC2 which are additionally equipped at their individual outputs with latches LT1 and LT2 to be controlled by clocks CK1b and CK2b. In this embodiment, the latches LT1 and LT2 play the role of the level holder. Here, the logic circuits LC1 and LC2 are combinational logic circuits each of which is composed of one or a plurality of logic gates. These two logic circuits LC1 and LC2 are alternately operated in synchronism with the clocks so that switches SWH1 and SWL1 and switches SWH2 and SWL2 are alternately turned ON and OFF by the clocks to interrupt the subthreshold current of the logic circuit which is not operated. According to this embodiment, it is possible to realize a low-power LSI having a low operating voltage and a small subthreshold current.

Figure 40:
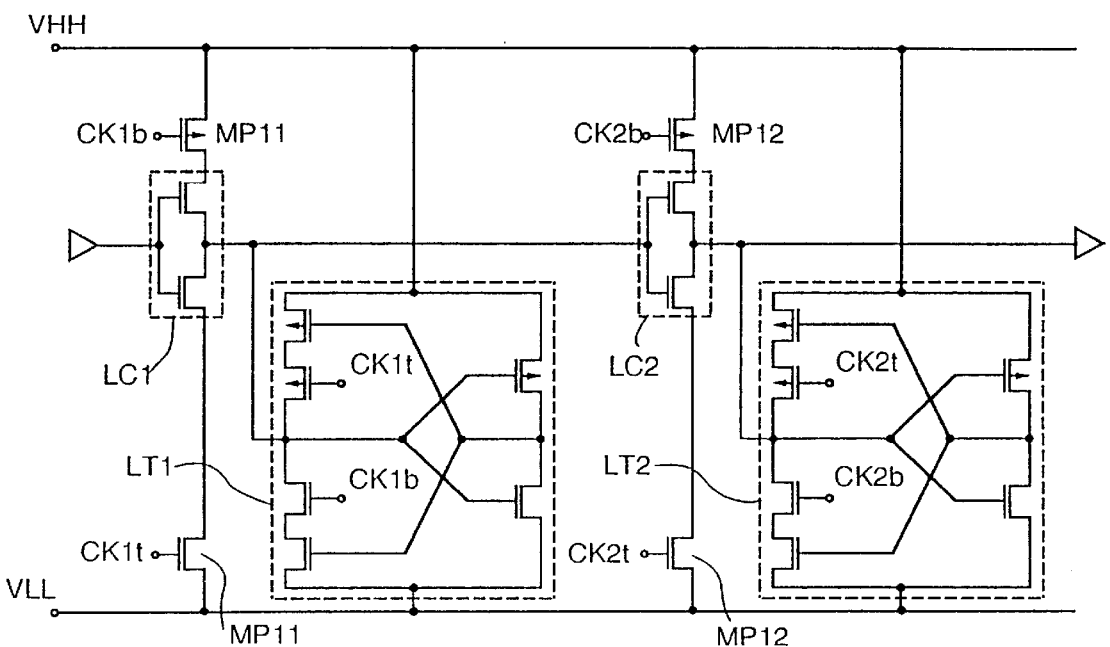
FIG. 40 is a circuit diagram showing an inverter operating with a dual-phase clock.
Figure 41:
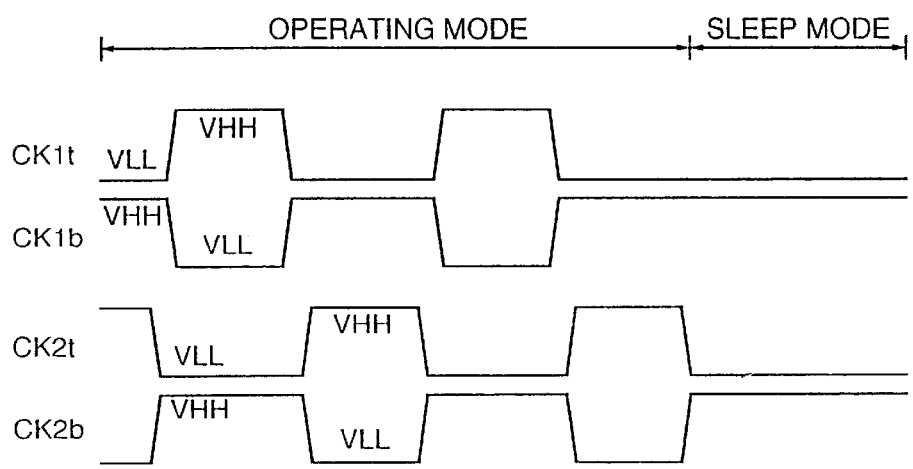
FIG. 41 is a timing chart useful for explaining the operation of the circuit shown in FIGS. 39 and 40.

The operations will be described by using a specific circuit embodiment shown in FIG. 40 and the timings of the control clocks illustrated in FIG. 41. For simplicity, the logic circuits LC1 and LC2 are individually exemplified by one inverter. Moreover, the latches LT1 and LT2 are exemplified by the level holder shown in FIG. 34 but may be exemplified by the circuit shown in FIG. 29. Clocks CK1t and CK2t alternately take the high level without any mutual superposition. The clocks CK1b and CK2b are the signals which are inverted from the clocks CK1t and CK2t, respectively. Here, the high-speed operations can be achieved if the MOS transistors composing the logic circuits LC1 and LC2 have their threshold voltages set at the low level. On the other hand, the MOS transistors having their gates supplied with the clocks must be able to interrupt the subthreshold current when turned OFF. For this necessity, it is sufficient to raise the threshold voltages or to set the high level of the clocks higher than the high voltage VHH and the low level lower than the low voltage VLL.

In the operation mode, the logic circuit LC1 is operated while the clock CK1t is at the high level. At this time, the clock CK2t is at the low level so that the latch LT2 latches the data to be supplied thereto. Moreover, since the logic circuit LC2 need not operate, the transistors MP12 and MN12 are turned OFF to interrupt the subthreshold current. While the clock CK2t is at the high level, on the contrary, the latch LT1 latches the data, and the logic circuit LC2 operates so that the subthreshold current of the logic circuit LC1 can be interrupted. In short, the current of either the logic circuit LC1 or LC2 can be interrupted to reduce the subthreshold current to one half of the prior art.

In order to reduce the power in the recent microprocessor operating at 3.3 V to 5 V, as described above, the charging and discharging currents are reduced by interrupting the supply of clocks to an unnecessary circuit in the low-power backup mode (i.e., the sleep mode). In this embodiment, when both the clocks CK1t and CK2t are held at the low level in the sleep mode, as shown in FIG. 41, both the transistors MP11 and MN11 and the transistors MP12 and MN12 are turned OFF to interrupt the current flow through both the logic circuits LC1 and LC2. As a result, the effect for reducing the subthreshold current in the sleep mode is far higher than that in the operation mode.

Figure 42A:
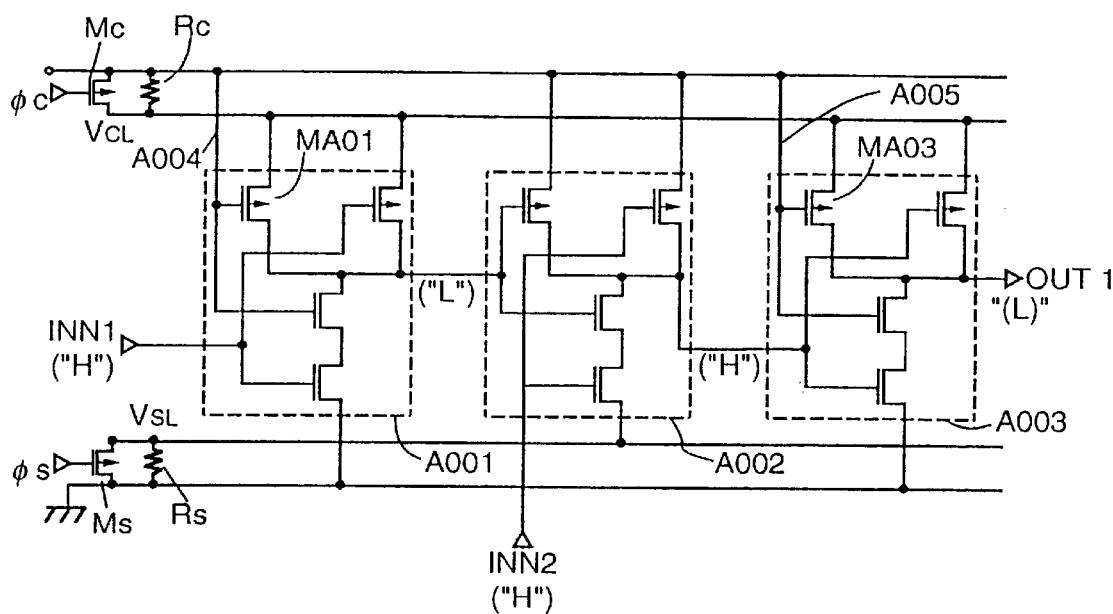
FIG. 42(a) shows an embodiment of the invention applied to a gate array.
Figure 42B:
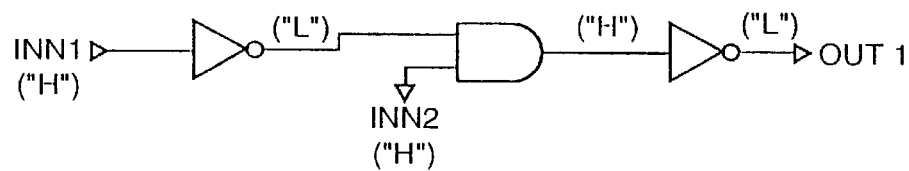
FIG. 42(b) shows a logic diagram.

FIG. 42 shows another embodiment of this invention, in which the invention is applied to a gate array. This gate array is a digital logic circuit so that the foregoing embodiments can be applied to reduce the subthreshold current. In the gate array, however, some gates are left unused and inactivated when the logic circuit is to be constructed, as will be described in the following. FIG. 42(a) shows the embodiment in which the logic shown in FIG. 42(b) is constructed in a one-circuit block of the gate array using two-input NANDs as its basic cells. In this Figure, blocks A001, A002 and A003 enclosed by broken lines are the basic NAND cells. Moreover, INN1 and OUT1 designate the input and output of this logic circuit block, respectively. In case the inverter is constructed of the NAND cells, as shown, it is a current practice to fix inputs A004 and A005 at the high level ($V_{CC}$) thereby to inactivate the corresponding gates. The gates thus inactivated frequently occupy several ten % of the usable gates. Thus, the subthreshold currents that flow through the inactivated gates cannot be ignored in the low-voltage gate array in which the threshold voltages of the transistors are scaled down. As shown, transistors MA01 and MA03 have their sources connected with a second power source line $V_{CL}$ which is separated from the power source $V_{CC}$ through the transistor $M_C$ and the resistor RC. In the low-power mode, the signal $\phi_C$ is set to the high level to cut off the transistor $M_C$. Then, the transistors MA01 and MA03 are inversely biased between their gates and sources and are deeply cut off so that the subthreshold currents of the inactivated gates can be drastically reduced. As to the active gates, however, the leakage currents can also be prevented, if the p-channel transistors have their sources connected with $V_{CC}$ or $V_{CL}$ whereas the n-channel transistors have their sources connected with $V_{SL}$ or $V_{SS}$ in accordance with the logic states (at the high level "H" or the low level "L", as shown) of the individual gate outputs for a period requiring the low lower dissipation as in the standby state. Incidentally, as to the inactive gate, no current has to be supplied to the transistors even when they are in operation so that an interconnection other than the power source line $V_{CL}$ formed to have a minimum interconnection width and a high impedance can be used. For this interconnection, the transistor $M_C$ is not always essential, and only use of the resistor $R_C$ may be sufficient.

Figure 43A:
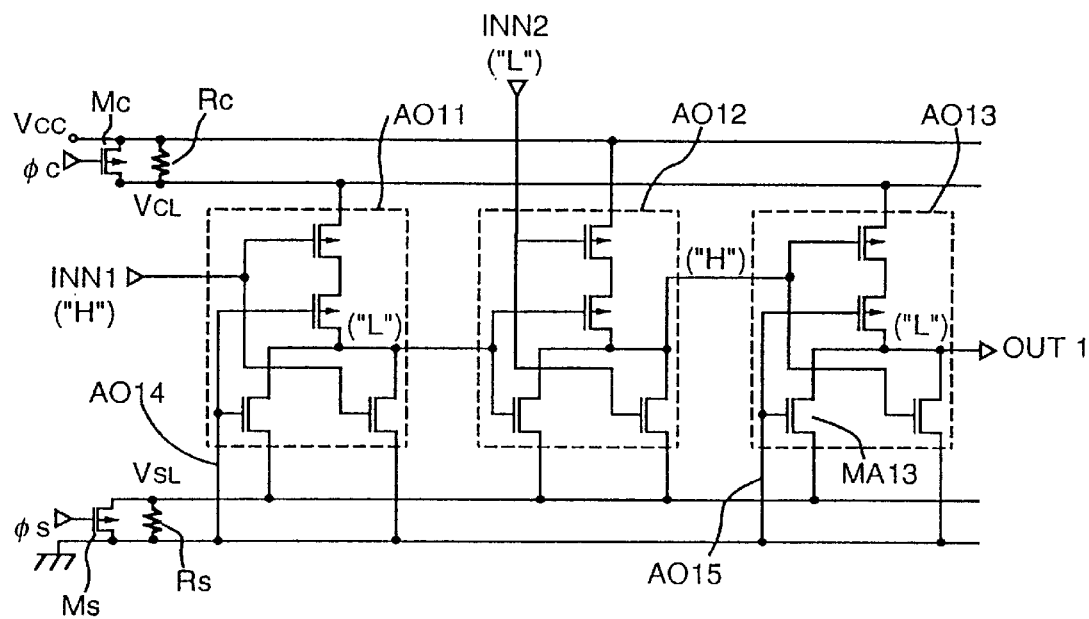
FIG. 43(a) shows another embodiment of the invention applied to a gate array.
Figure 43B:
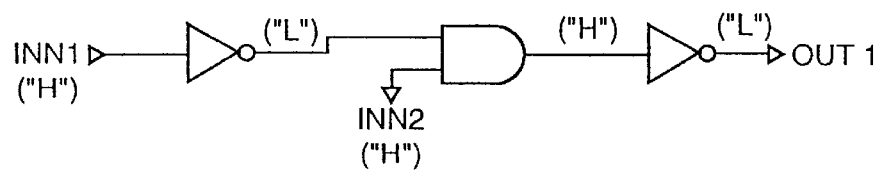
FIG. 43(b) shows a logic diagram.

FIGS. 43A and 43B show another embodiment of this invention, in which the prevention of the subthreshold current according to this invention is applied to the inactive gates in a gate array composed of basic cells of two-input NORs. FIG. 43A shows the embodiment in which the logic shown in FIG. 43B is composed of the NOR cells. In FIG. 43A, broken lines A001, A012 and A013 are the basic NOR cells. In case the inverter is composed of the NOR cells, it is a current practice to fix an input A014 or A015 at the LOW ($V_{SS}$) level thereby to inactivate the corresponding gates. If the transistors MA11 and MA13 have their sources connected at this time with the lower source line $V_{SL}$, they can be deeply cut off on the basis of the aforementioned operating principle, to prevent the subthreshold current.

Moreover, as the LSI chip has its scale enlarged, a test circuit for testing other circuit groups is packaged on the chip. This test circuit can have its operation interrupted during ordinary chip operation (other than the testing time). In this case, the foregoing embodiments are effective for reducing the subthreshold current of the test circuit.

An example in which the individual embodiments thus far described are applied to a single-chip microprocessor is described next. First of all, a microprocessor having the foregoing power reducing mechanisms will be described. In the microprocessor of the prior art, the power is controlled by controlling the entire chip at one time. Since the chip i386SL of Intel, for example, has a completely static internal circuit, its internal status can be retained, even if the input of a clock to the chip is interrupted, to reopen the operation when the input of the clock is applied again. Thus, the operation of the entire chip is interrupted to reduce the power of the entire system by interrupting the input of the clock. However, this is possible only when the power source voltage is as high as 3.3 V to 5 V as in the prior art. This is because the MOS transistors composing the CMOS circuit can take threshold voltages as high as about 0.4 to 0.5 V so that their subthreshold currents can be reduced to negligible values. As has already been described thereinbefore, however, the high-speed system to be operated by a power source voltage of 2 V or less or by the voltage of one battery of about 0.9 or 1.6 V cannot have its power reduced any more even if the clock is interrupted. In the LSI composed of logic gates, e.g. mainly random gates, generally speaking, the number of the logic gates having varying input voltages is about 20% of all the multiple logic gates in the chip. The remaining about 80% logic gates have their inputs unvaried. Since the CMOS circuit of the prior art advantageously has a high threshold voltage, most of the power of the 80% of the logic gates can be neglected to reduce the power of the entire chip. However, this advantage cannot be expected any more at a low power source voltage. Next will be described a microprocessor as one example of an electronic apparatus in which the entire chip can have its power reduced for operation at a low power source voltage.

Figure 44:
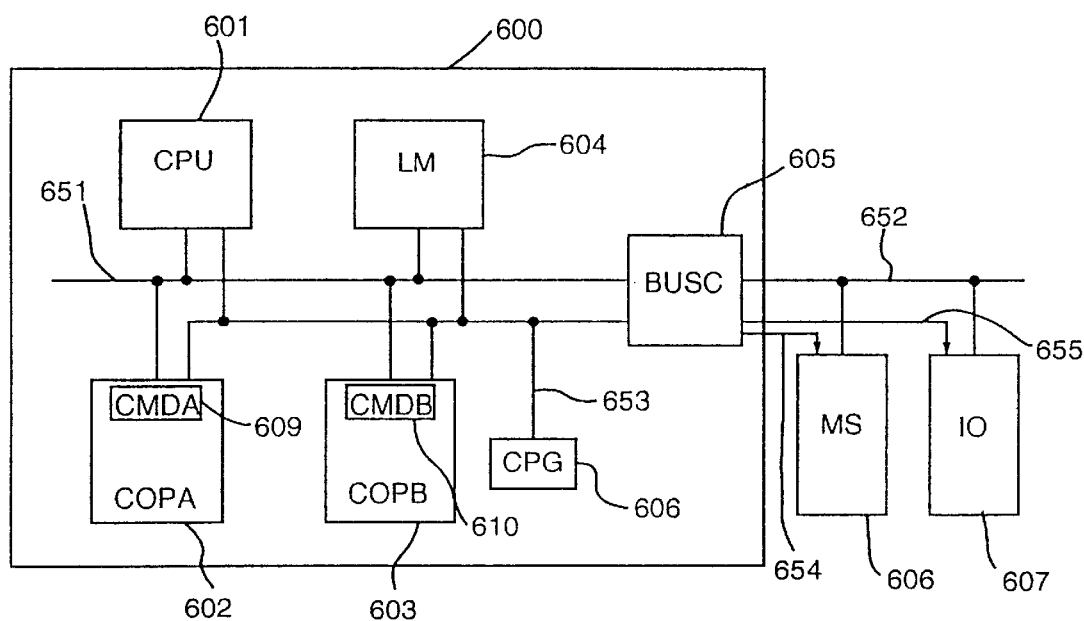
FIG. 44 is a block diagram showing a single-chip microprocessor constructed according to an embodiment of the invention.

FIG. 44 shows a single-chip microprocessor having a power reducing mechanism of this invention packaged therein. This microprocessor is featured in that the chip is equipped with a mechanism for controlling the active/standby modes for each unit, as will be described in the following. Reference numeral 600 designates the single-chip microprocessor. This microprocessor 600 is packaged thereover with a central processing unit (CPU) 601, a co-processor A (COPA) 602, a co-processor B (COPB) 603, a local memory (LM) 604 and a bus control unit (BUSC) 605. These individual units are connected through an internal bus 651 over the chip. Moreover, the units are connected with the chip externally through the BUSC 605 and an external bus 652. With this external bus 652, there are connected a main memory (MS) 606, an input/output device (IO) 607 and so on. The CPG 606 is a clock generator, and the individual units in the chip operate in synchronism with a clock signal 653 generated by the CPG 606.

The COPA 602, the COPB 603 and the LM 604 individually have two operating states, one of which is the sleep state. In this state, the individual units do not operate so that the power to be dissipated is remarkably reduced. Another is the active state. In this state, the units execute the data reading/writing operations and other execute operations. Therefore, the power dissipation is not suppressed to a remarkably small value. The logic circuits constructed of these individual units are exemplified by the circuits of FIGS. 18 to 26, FIGS. 28 to 32 and FIGS. 39 to 41. As a result, the power dissipation in the sleep state can be reduced. In the active state, too, the power can also be reduced by controlling the active state finely for each phase of the dual-phase clocks with the circuits of FIGS. 39 to 41, for example. The MS 606 and the IO 607 have the active/sleep as states, too. Signals 654 and 655 to be outputted from the microprocessor 600 are signals for instructing to activate the MS 606 and the IO 607, respectively.

The co-processors COPA 602 and COPB 603 are basically the units of the same kind and execute the specified operations only when the program executed in the CPU contains an instruction to require the execution of the COPA or COPB. It is sufficient that the active state is effected only at that time while the sleep state prevails in the remaining period. In an ordinary program, the request for this execution is not so frequent. These co-processors are characterized in that they are equipped with a number of register files and a (or a plurality of) proprietary execution unit so that they have a number of transistors in their entirety.

On the other hand, the LM 604 is stored with the programs and data required by the CPU so that the frequency of its access is high. In case, however, the CPU has a cache memory packaged therein, the execution is performed in the CPU. This structure is characterized in that the accessing frequency is dropped to elongate the period of the sleep state.

The CPU 601 is a unit for executing instructions and processing data and for executing programs at all times (at an activity ratio of 100%). The CPU contains the fundamentals of an ordinary processor, such as a general purpose register, an execution unit and so on and may contain a cache memory, as the case may be. The instructions or data are stored in the LM 604 or MS 606. The LM 604 is an on-chip memory having a small capacitance but -accessible at a high speed so that it is stored with the instructions or data to be frequently used by the CPU 601. The instructions or data, which need not be accessed so frequently, are stored in the memory MS 606 which has a large capacitance but an intermediate speed. The CPU 601 can access the LM 604 directly through the internal bus 651. On the other hand, the access to the MS 606 is executed through the internal bus 651, the BUSC 605 and the external bus 652. The BUSC 605 includes external bus buffers having a bit width of about 32 to 128 bits. The BUSC may be activated only for accessing a memory or device outside of the chip. The BUSC may be held in the sleep state if the program or data it needs are present in the chip.

The COPA 602 is a co-processor for executing multiplication, division and calculations of roots and absolute values and has a proprietary execution unit packaged therein for processing these calculations at high speed. The COPB 603 is a co-processor for executing functional calculations of trigonometric functions and distances and has a proprietary execution unit for processing those calculations at a high speed. The CPU 601 starts the executions of the individual co-processors by writing commands for instructing the operations required into command registers CMDA 609 and CMDB 610 in the COPA 602 and COPB 603, by way of the internal bus 651. The individual co-processors are in the sleep state before the executions are started, so that little power is dissipated.

Figure 45:
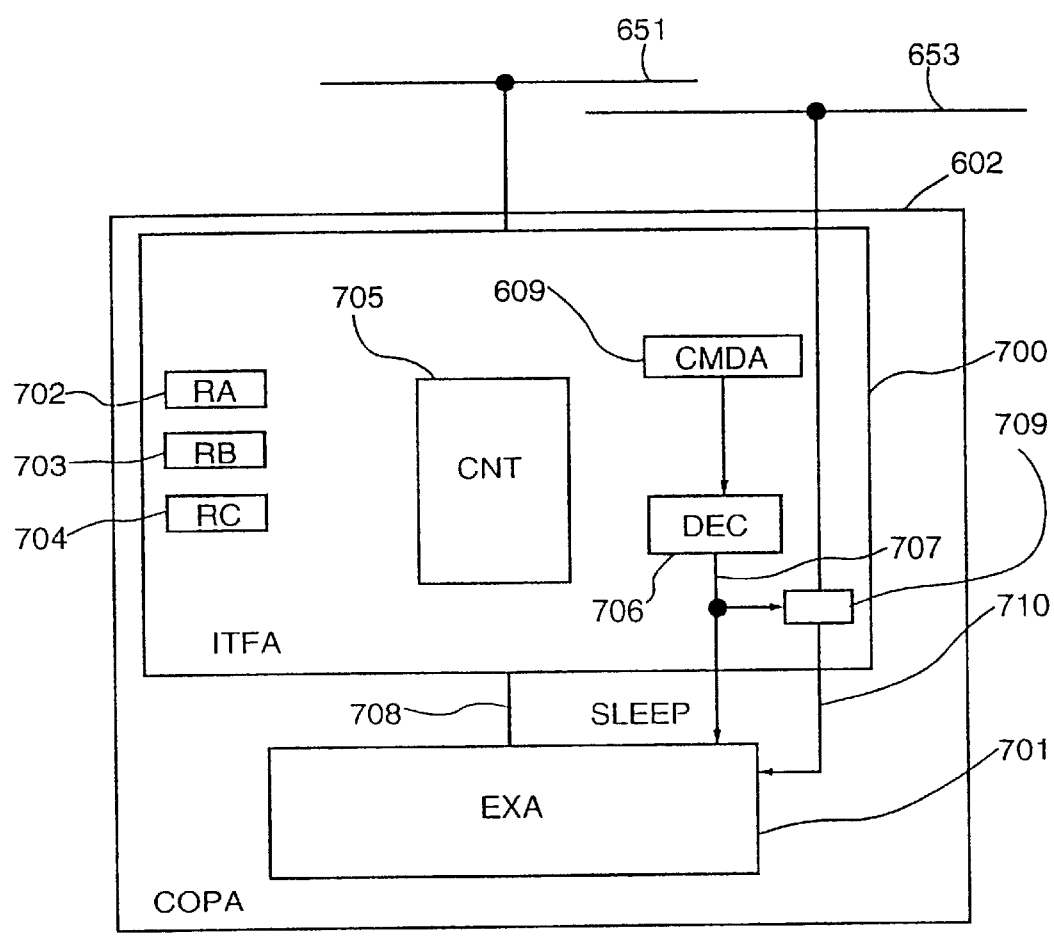
FIG. 45 is a diagram showing an internal structure of the co-processor of the microprocessor of FIG. 44.

FIG. 45 is a diagram showing the internal constructions of the COPA 602. The inside is constructed of two blocks ITFA 700 and EXA 701. The ITFA 700 is composed of a command register CMDA 609, a command decoder DEC 706, operand registers RA 702, RB 703 and RC 704, and a control circuit CNT 705. The EXA 701 has a proprietary execution unit for processing the multiplications, the divisions and the calculations of roots and absolute values at a high speed, and a control circuit for controlling the execution unit. The command sent from the CPU 601 through the internal bus 651 is latched in the CMDA 609 and decoded by the DEC 706 to cause the EXA 701 to execute the operations instructed by that command. The command is divided into one of multiplication, division, and calculations of either roots or absolute values. The source operands are sent from the CPU 601 and stored in the RA 702 and RB 703, and the executed results of the EXA 701 are stored in the RC 704 and read out by the CPU 601. The EXA 701 is in the sleep state while it is not executing. When the command is decoded by the DEC 706, a signal for causing the EXA 701 to execute the operation instructed by the command is generated so that the EXA 701 starts its execution. During this execution, the EXA 701 is in the active state. After this execution, the EXA 701 stores the results in the RC 704 to clear the CMDA 609 to zero. When the DEC 706 detects that the content of the CMDA 609 is zero, the EXA 701 is brought into the sleep state by asserting a SLEEP signal 707. The CNT 705 controls the reading/writing and zero-clearing operations for the individual registers 609, 702, 703 and 704. The ITFA 700 is always in the active state so as to receive the commands from the CPU at all times. The clock signal 653 generated by the CPG 606 is used in the ITFA 700. On the other hand, a EXA clock signal 710 is outputted through a gate circuit 709 and used as a clock for the EXA 701. When the SLEEP 707 is asserted, the gate circuit 709 interrupts the EXA clock 710 so that the clock is not supplied to the EXA 701. As a result, the clock of the EXA 701 is also interrupted in the sleep state. By this SLEEP signal, for example, the switches of the circuits of FIGS. 18 to 26 or FIGS. 28 to 32 are controlled to reduce the subthreshold current in the sleep state.

The EXA 701 contains not only a proprietary execution unit but also a register for latching the intermediate result of the execution, a register for latching the execution state, and a latch for controlling the execution. These registers and latches to be used are exemplified by the circuits of FIG. 35 and FIG. 37. For the case of the circuit of FIG. 35, the internal state of the latch is broken once the sleep state is entered. For the case of the circuit of FIG. 37, on the other hand, the internal state of the latch is not broken even if the sleep state is entered. As a result, when the active state is restored after the sleep state is once entered, the temporary executions that were suspended can be reopened.

The COPB is a co-processor for executing the functional calculations of trigonometric functions and distances and is given an internal structure and an operation similar to that of the COPA 602.

Figure 46:
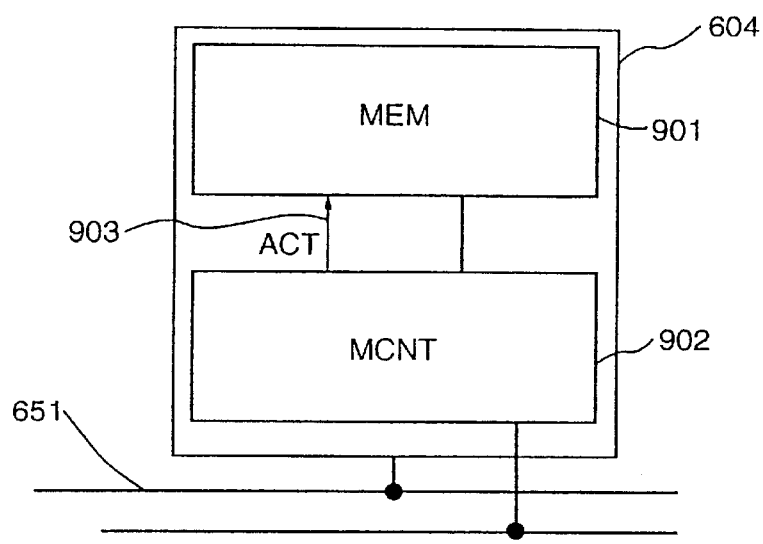
FIG. 46 is a diagram showing the internal structure of the local memory of the microprocessor shown in FIG. 44.

FIG. 46 shows the internal structure of the LM 604. MEM 901 is a memory unit for storing information such as instructions/data. MCNT 902 receives an access demand from the CPU 601 to read the data stored in the MEM 901 and to write the data in the MEM 901. When an access demand is made by the CPU 601, the MCNT 902 asserts a signal ACT 903 for activating the MEM 901 and activates the MEM 901. Without the access demand, the ACT 903 is negated so that the MEM 901 is in the sleep state. By this ACT signal, the switches of the circuits of FIGS. 18 to 26 or FIGS. 28 to 32, for example, are controlled to reduce the subthreshold current in the sleep state. In this state, too, the data are retained in the memory. The MCNT 902 is always in the active state so that it may receive the access demand from the CPU at all times.

Figure 47:
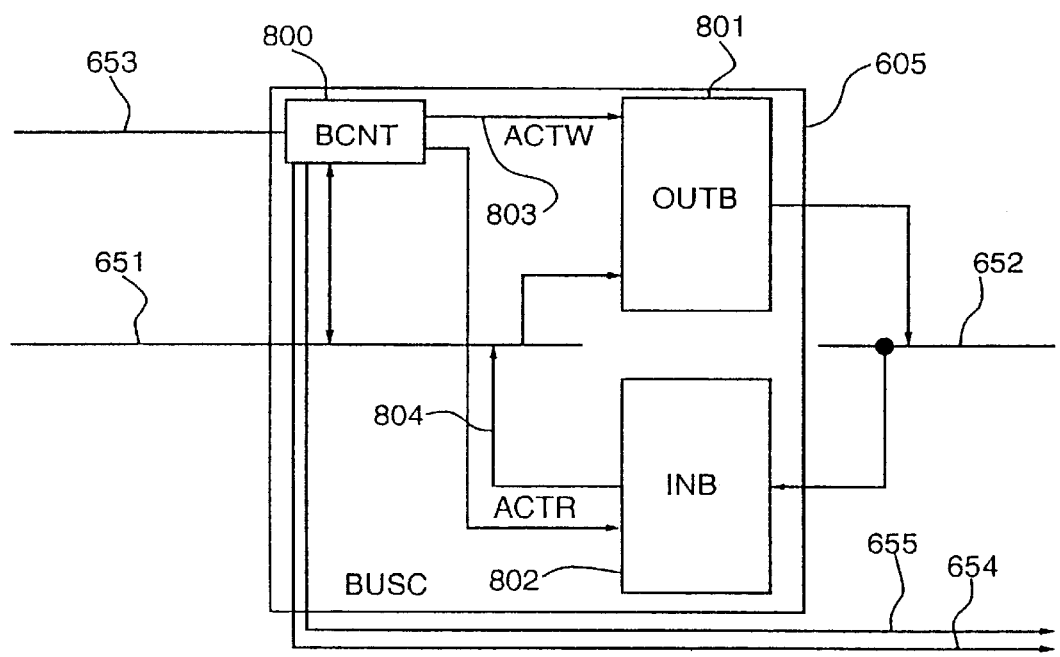
FIG. 47 is a diagram showing the internal structure of the bus control unit for the microprocessor of FIG. 44.

The CPU 601 accesses the instructions or data to the MS 606 through the internal bus 651, the BUSC 605 and the external bus 652. Only at this time, the BUSC 605 is activated. FIG. 47 shows the-internal structure of the BUSC 605. BCNT 800 is a circuit for controlling the access to the external bus 652 in response to the demand of the CPU 601. OUTB 801 is a driver circuit for driving the external bus 652, when data are supplied from the internal bus 651 to the external bus 652, and is activated only at this time. INB 802 is a driver circuit for driving the internal bus 651, when data are supplied from the external bus 652 to the internal bus 651, and is activated only at this time. When the BCNT 800 receives a write demand for the MS 606 or the IO 607 outside of the chip from the CPU 601, it asserts ACTW 803 to activate the OUTB 801. On the other hand, when the BCNT receives a read demand of the MS 606 or the IO 607 outside of the chip from the CPU 601, it asserts ACTR 804 to activate the INB 802. For the period other than those operations, the OUTB 801 and the INB 802 are in the sleep state. The BCNT 800 is always active so that it may receive the access demand to the outside of the chip. The BCNT 800 further outputs the active support signal 654 for the MS 606 and the active instruct signal 655 for the IO 607. In case the CPU 601 demands the BCNT 800 to access the MS 606, the BCNT 800 detects the demand to assert the signal 654 to activate the MS 606. The signal 655 is also used for similar operations.

The OUTB 801 is exemplified by the output buffer of FIG. 25, and the switches $S_S$ and $S_C$ are controlled in accordance with the ACTW signal. This OUTB drives a high load (e.g., the external bus 652) and needs the MOS transistors having a large channel width in the number of the bus width (e.g., 64 bits) so that its total channel width is remarkably large. As a result, the reduction of the subthreshold current of the OUTB highly contributes to the reduction of the current of the entire system.

The INB 802 used is exemplified by the input buffer of FIG. 26, and the ACTR signal is supplied to the SB terminal. As a result, the internal bus 651 has its voltage level fixed in the sleep state. Thus, the units COPA, COPB and LM connected with the internal bus 651 can be exemplified by the circuits of FIGS. 18 to 25 so that these units can have their subthreshold currents reduced easily.

The MS 606 is exemplified by a DRAM. This DRAM may be an ordinary DRAM or a synchronous DRAM, as is disclosed on pp. 43–49 of IEEE Spectrum, October 1992. In this synchronous DRAM, the supply of the clock to the chip inside can be controlled by a clock enable/disable signal so that the current dissipation can be effectively reduced by utilizing the signal. Specifically, the clock supply to the chip inside is interrupted in the sleep state. Moreover, the subthreshold current of the internal circuit can be reduced by using the circuit of FIG. 26 as the input buffer of the synchronous DRAM and by applying the clock enable/disable signal to the SB terminal.

Figure 48:
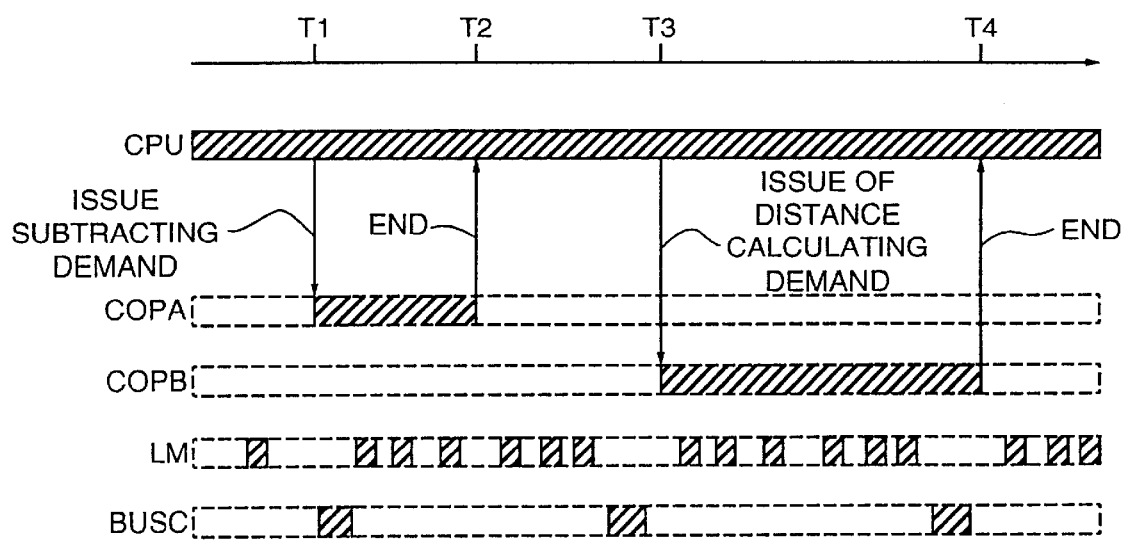
FIG. 48 is a timing diagram useful for explaining the operation of the microprocessor of FIG. 44, according to the present invention.
Figure 49:
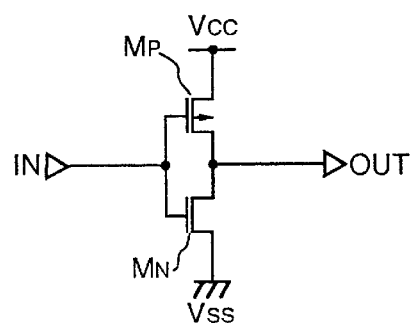
FIG. 49 is a circuit diagram of a conventional CMOS inverter.
Figure 50:
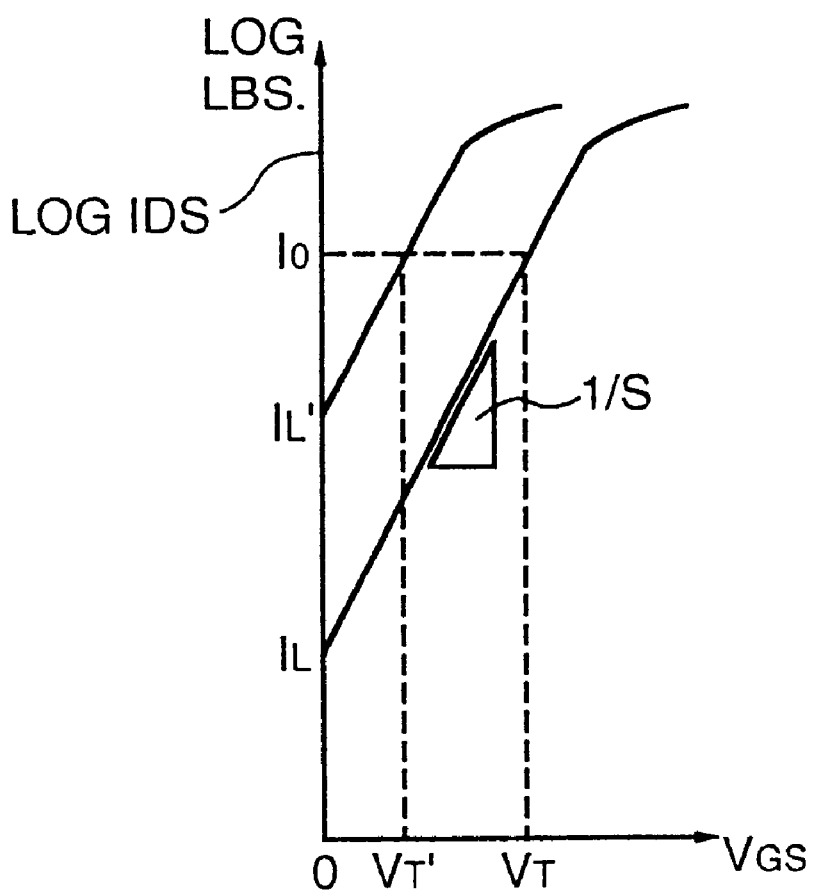
FIG. 50 is a diagram showing subthreshold characteristics of a MOS transistor.

FIG. 48 illustrates examples of the overall operations of the microprocessor 600. The abscissa indicates the time, and hatching lines indicate that the individual units or blocks are active. In this example, the CPU 601 issues a dividing command to the COPA 602 at time T1, and the COPA 602 executes the divisions from time T1 to time T2 and reports the end of calculations to the CPU 601 at time T2 until it comes again into the sleep state. After this, the CPU 601 issues a distance calculating command to the COPB 603 at time T3, and the COPB 603 executes the distance calculations from time T3 to time T4 and reports the end of calculations to the CPU 601 at time T4 until it comes again into the sleep state. The LM 604 is activated only when the access to data is demanded by the CPU 601. The BUSC 605 is also activated only when the CPU 601 accesses the outside. Thus, the individual units and blocks in the microprocessor 600 have their active/sleep states precisely controlled so that the microprocessor 600 can have its power dissipation greatly reduced.

This embodiment of the invention is applied internally of the chip, but it is self-explanatory that this invention can be expanded to an embodiment of a computer system constructed of a plurality of chips. For example, this invention can be easily applied to the case in which the individual units 601 to 605 of FIG. 44 are made of different chips.

Respective embodiments of the present invention have been described above taking a MOS semiconductor circuit device as an example, but the present invention is also applicable to a metal insulator semiconductor (MIS) circuit device.

What is claimed is:

1. A semiconductor integrated circuit comprising:

a first potential point to which a first voltage is supplied;

a second potential point to which a second voltage lower than said first voltage is supplied;

a first MOS transistor of a first type whose source is coupled to a first node and whose gate is coupled to an input node;

a second MOS transistor of a second type whose source is coupled to a second node electrically connected to said second potential point, whose drain is coupled to a drain of said first MOS transistor and whose gate is coupled to said input node;

an input control circuit coupled to said input node; and a control circuit connected to receive a control signal, said control circuit being provided between said first node and said first potential point;

wherein said control circuit permits a first current to flow between said first potential point and said second node through source/drain paths of said first and second MOS transistors due to a change of level of an input signal inputted to said input node when said control signal is in a first state;

wherein said control circuit limits the current flowing between said first potential point and said second node to a second current smaller than said first current in response to said control signal being set to a second state different from said first state, and irrespective of said level of said input signal, said input control circuit controls a level of said input node to a predetermined potential such that said first MOS transistor is in an off state.

2. A semiconductor integrated circuit according to claim 1, wherein leak current flows through the source/drain path of the first MOS transistor even if a voltage difference between a gate and a source of said first MOS transistor is 0 Volts, and wherein leak current flows through the source/drain path of the second MOS transistor even if a voltage difference between a gate and a source of said second MOS transistor is 0 Volts.

3. A semiconductor integrated circuit according to claim 1,
wherein said control circuit includes a switching element and resistor element provided between said first node and said first potential point;
wherein said switching element is in an on state in response to said control signal being set to said first state and said first current flows mainly via said switching element, and
said switching element is in an off state in response to said control signal being set to said second state and said second current flows mainly via said resistor element.

4. A semiconductor integrated circuit comprising:
a first potential point to which a first voltage is supplied;
a second potential point to which a second voltage lower than said first voltage is supplied;
a first MOS transistor of a first type whose source is coupled to a first node electrically connected to said first potential point and whose gate is coupled to an input node;
a second MOS transistor of a second type whose source is coupled to a second node, whose drain is coupled to a drain of said first MOS transistor and whose gate is coupled to said input node;
an input control circuit coupled to said input node; and
a control circuit connected to receive a control signal, said control circuit being provided between said second node and said second potential point;
wherein said control circuit permits a first current to flow between said first node and said second potential point through source/drain paths of said first and second MOS transistors due to a change of level of an input signal inputted to said input node when said control signal is in a first state;
wherein said control circuit limits the current flowing between said first node and second potential point to a second current smaller than said first current in response to said control signal being set to a second state different from said first state, and
irrespective of said level of said input signal, said input control circuit controls a level of said input node to a predetermined potential such that said second MOS transistor is in an off state.

5. A semiconductor integrated circuit according to claim 4,
wherein leak current flows through the source/drain path of the first MOS transistor even if a voltage difference between a gate and a source of said first MOS transistor is 0 Volts, and
wherein leak current flows through the source/drain path of the second MOS transistor even if a voltage difference between a gate and a source of said second MOS transistor is 0 Volts.

6. A semiconductor integrated circuit according to claim 4,
wherein said control circuit includes a switching element and resistor element provided between said second node and said second potential point;
wherein said switching element is in an on state in response to said control signal being set to said first state and said first current flows mainly via said switching element, and
wherein said switching element is in an off state in response to said control signal being set to said second state and said second current flows mainly via said resistor element.

7. A semiconductor integrated circuit comprising:
a first potential point;
a second potential point;
a circuit having at least a first MOS transistor whose source is coupled to a first node and whose source/drain path is between said first node and a second node electrically connected to said second potential point,
wherein leak current flows through the source/drain path of the first MOS transistor even if a voltage difference between a gate and a source of said first MOS transistor is 0 Volts and an input node is connected to a gate of the first MOS transistor;
a control circuit connected to receive a control signal, said control circuit being provided between said first node and a first potential point; and
an input control circuit which is coupled to said input node and receives an input signal,
wherein said control circuit permits a first current to flow between said first potential point and said second node through the source/drain path of said first MOS transistor due to a level of said input signal inputted to said input control circuit when said control signal is in a first state;
said control circuit limits the current flowing between said first potential point and second node to a second current smaller than said first current in response to said control signal being set to a second state different from said first state;
said input control circuit controls said input node to a predetermined level to make said first MOS transistor in an off state irrespective of a level of said input signal at least when said control signal is set to said second state.

8. A semiconductor integrated circuit according to claim 7,
wherein said control circuit includes a switching element and resistor element provided between said first node and said first potential point;
wherein said switching element is in an on state in response to said control signal being set to said first state and said first current flows mainly via said switching element, and
said switching element is in an off state in response to said control signal being set to said second state and said second current flows mainly via said resistor element.

9. A semiconductor integrated circuit having at least two operating states, a first state having lower power consumption than a second state comprising:
a first potential point;
a second potential point;
a first MOS transistor receiving a first signal whose source/drain path is between a first node electrically connected to said first potential point and a second node and whose source is coupled to said second node;
a switching circuit receiving a second signal provided between said second node and said second potential point; and
an input control circuit which outputs said first signal, wherein leak current flows through the source/drain path of the first MOS transistor even if a voltage difference between a gate and a source of said first MOS transistor is 0 Volts;

wherein, when said semiconductor integrated circuit is in said second state, a first current according to a level of said first signal flows through the source/drain path of said first MOS transistor;

wherein, when said semiconductor integrated circuit is in said first state, said switching circuit is in an off state in response to said second signal and said input control circuit controls a level of said first signal to a predetermined level to make said first MOS transistor in an off state irrespective of a level of said first signal.

10. A semiconductor integrated circuit according to claim 9, wherein said switching circuit includes at least a second MOS transistor whose source/drain path is between said second node and said second potential point.

11. A semiconductor integrated circuit according to claim 10, wherein said first MOS transistor and said second MOS transistor have a same conductivity type.

12. A semiconductor integrated circuit according to claim 11, further comprising:

a third MOS transistor receiving said first signal whose source is coupled to said first node and whose drain is coupled to a drain of said first MOS transistor, wherein a conductivity type of said third MOS transistor is different from a conductivity type of said first MOS transistor.

13. A semiconductor integrated circuit having at least two operating states comprising:

a first potential point;

a second potential point;

a first logic gate having a first input node, a second input node and a first output node;

a second logic gate having a third input node and a second output node, wherein said second logic gate is provided between said second potential point and a first node and said third input node is connected to said first output node and said second output node is connected to said second input node; and a control circuit connected to receive a control signal, said control circuit being provided between said first node and said first potential-point;

wherein a control signal is inputted to said first input node;

wherein said control circuit permits a first current to flow through a source/drain path of a MOS transistor included in said second logic gate in response to said control signal being in a first state and said control circuit limits current flowing through said source/drain path of said MOS transistor to a second current smaller than said first current in response to said control signal being in a second state;

wherein a logic level of said first output node is one of two levels in accordance with a logic level of said second input node during said control signal being in said first state, and said logic level of said first output node is a predetermined one which voltage is decided based on a voltage of said second potential point of said two levels irrespective of said logic level of said second input node during said control signal being in said second state;

wherein leak current flows through a source/drain path of said MOS transistor even if a voltage difference between a gate and a source of said MOS transistor is 0 Volts.

14. A semiconductor integrated circuit according to claim 13:

wherein said control circuit includes a switching element and resistor element both being provided between said first node and said first potential point;

wherein said switching element is in an on state in response to said control signal being set to said first state and said first current flows mainly via said switching element, and said switching element is in an off state in response to said control signal being set to said second state and said second current flows mainly via said resistor element.

* * * * *